(12) United States Patent
Seki et al.

(10) Patent No.: US 10,616,509 B2
(45) Date of Patent: Apr. 7, 2020

(54) IMAGING DEVICE AND CONTROL METHOD THEREOF, AND ELECTRONIC APPARATUS

(71) Applicant: SONY CORPORATION, Tokyo (JP)

(72) Inventors: Kenzaburo Seki, Tokyo (JP); Daisuke Miyakoshi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/546,571

(22) PCT Filed: Nov. 18, 2015

(86) PCT No.: PCT/JP2015/082372
§ 371 (c)(1),
(2) Date: Jul. 26, 2017

(87) PCT Pub. No.: WO2016/129163
PCT Pub. Date: Aug. 18, 2016

(65) Prior Publication Data
US 2018/0278858 A1  Sep. 27, 2018

(30) Foreign Application Priority Data

Feb. 12, 2015  (JP) .................................. 2015-025024

(51) Int. Cl.
*H04N 5/341* (2011.01)
*H04N 5/378* (2011.01)
(Continued)

(52) U.S. Cl.
CPC ........... *H04N 5/341* (2013.01); *H01L 27/146* (2013.01); *H04N 5/378* (2013.01);
(Continued)

(58) Field of Classification Search
CPC ............ H01L 27/146; H01L 27/14645; H04N 5/341; H04N 5/357; H04N 5/374; H04N 5/3745; H04N 5/378; H04N 9/07
See application file for complete search history.

(56) References Cited

U.S. PATENT DOCUMENTS

| 7,495,228 | B1 * | 2/2009 | Albagli | ............ | H01L 27/14663 250/370.09 |
| 8,077,232 | B2 * | 12/2011 | Hashimoto | ............ | H04N 9/045 348/229.1 |

(Continued)

FOREIGN PATENT DOCUMENTS

| CN | 101551462 A | 10/2009 |
| CN | 101753863 A | 6/2010 |

(Continued)

OTHER PUBLICATIONS

International Search Report and Written Opinion of PCT Application No. PCT/JP2015/082372, dated Jan. 26,1 2016, 02 pages of English Translation and 07 pages of ISRWO.

(Continued)

*Primary Examiner* — Amy R Hsu
(74) *Attorney, Agent, or Firm* — Chip Law Group

(57) ABSTRACT

An imaging device includes: a plurality of pixel units each of which includes a single read terminal and two or more pixels; and a controller that performs read operation with respect to each of the pixel units and starts, in each unit period, the read operation with respect to the predetermined number of the pixel units out of the plurality of the pixel units. The read operation includes sequentially reading pixel signals from the two or more pixels through the read terminal at a rate of one pixel every unit period.

15 Claims, 26 Drawing Sheets

(51) Int. Cl.
*H01L 27/146* (2006.01)
*H04N 5/3745* (2011.01)
*H04N 9/04* (2006.01)
*H04N 5/374* (2011.01)

(52) U.S. Cl.
CPC ..... *H04N 5/37457* (2013.01); *H04N 9/04551* (2018.08); *H04N 9/04557* (2018.08); *H01L 27/14645* (2013.01); *H04N 5/374* (2013.01)

(56) References Cited

U.S. PATENT DOCUMENTS

| | | | | |
|---|---|---|---|---|
| 8,786,731 | B2* | 7/2014 | Kasai | H04N 5/347 348/229.1 |
| 9,674,469 | B2* | 6/2017 | Moriwaka | H04N 5/3456 |
| 2001/0052941 | A1* | 12/2001 | Matsunaga | H01L 27/14609 348/308 |
| 2008/0088725 | A1* | 4/2008 | Matsunaga | H04N 5/347 348/302 |
| 2010/0141812 | A1 | 6/2010 | Hirota | |
| 2010/0245628 | A1* | 9/2010 | Hashimoto | H04N 9/045 348/231.99 |
| 2012/0113290 | A1 | 5/2012 | Nakata et al. | |
| 2013/0182165 | A1* | 7/2013 | Kimura | H04N 5/335 348/311 |
| 2016/0105623 | A1* | 4/2016 | Ikedo | H04N 5/378 348/320 |

FOREIGN PATENT DOCUMENTS

| | | |
|---|---|---|
| CN | 102469271 A | 5/2012 |
| CN | 103209309 A | 7/2013 |
| EP | 2194721 A2 | 6/2010 |
| JP | 2010-136226 A | 6/2010 |
| JP | 2012-104979 A | 5/2012 |
| KR | 10-2010-0066396 A | 6/2010 |
| KR | 10-2012-0049801 A | 5/2012 |

OTHER PUBLICATIONS

Office Action for CN Patent Application No. 201580075468.X, dated Aug. 27, 2019, 09 pages of Office Action and 16 pages of English Translation.

Office Action for JP Patent Application No. 2016-574628, dated Dec. 17, 2019, 4 pages of Office Action and 4 pages of English Translation.

* cited by examiner

[FIG. 1]
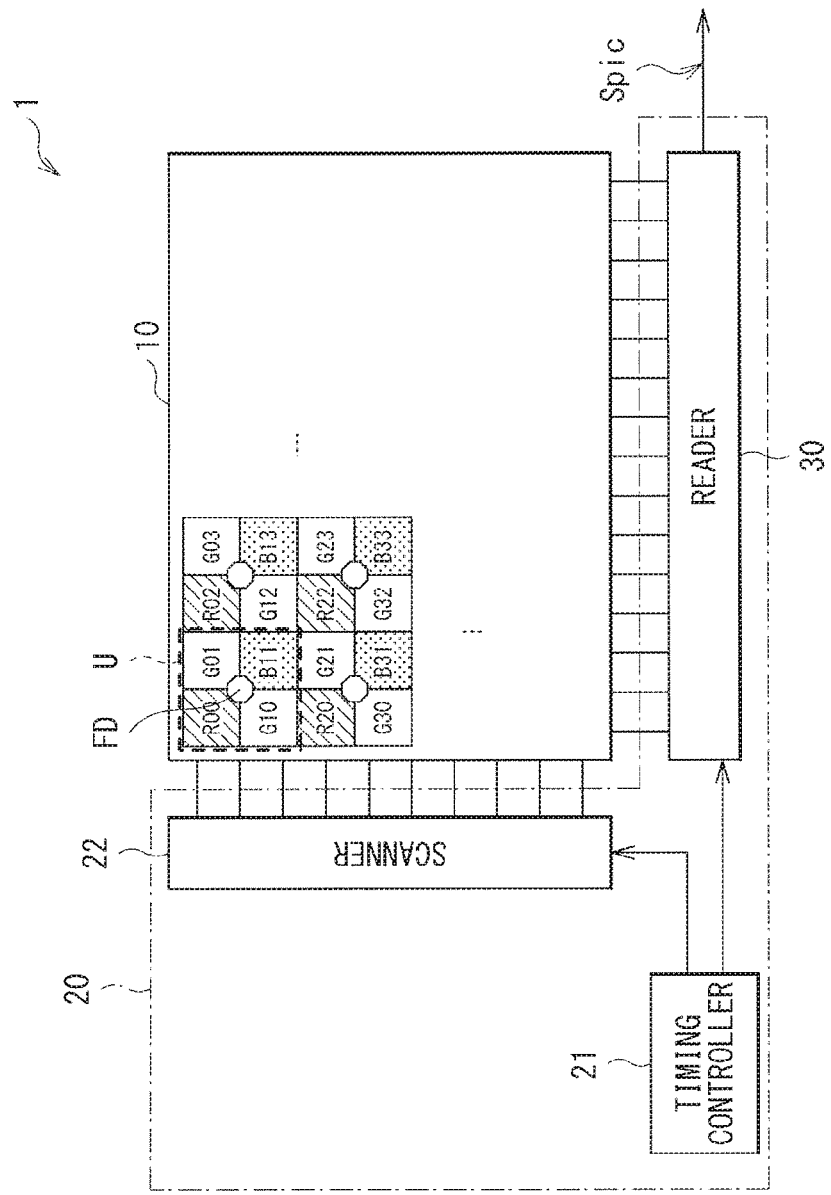

[ FIG. 2 ]
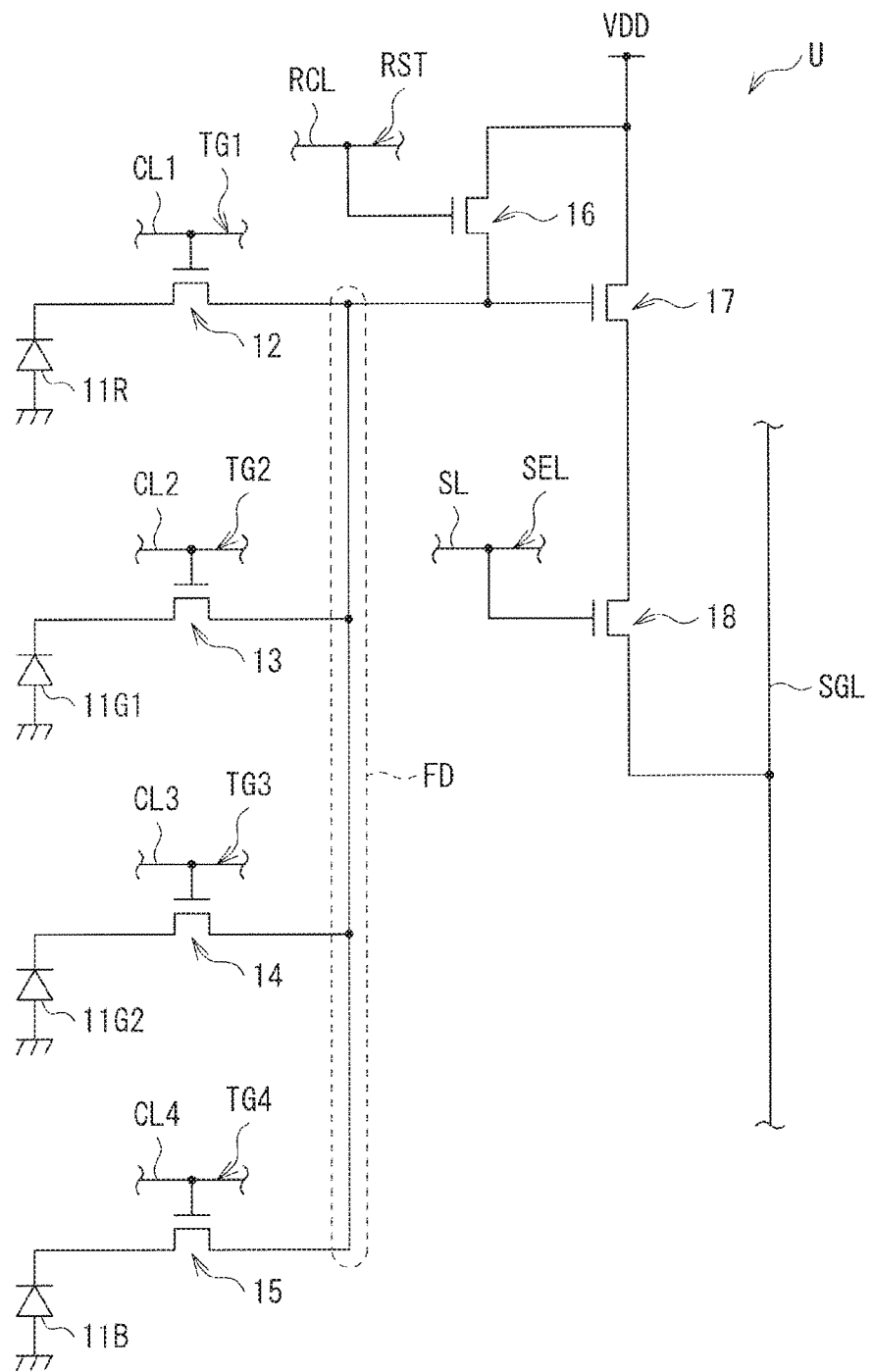

[FIG. 3]
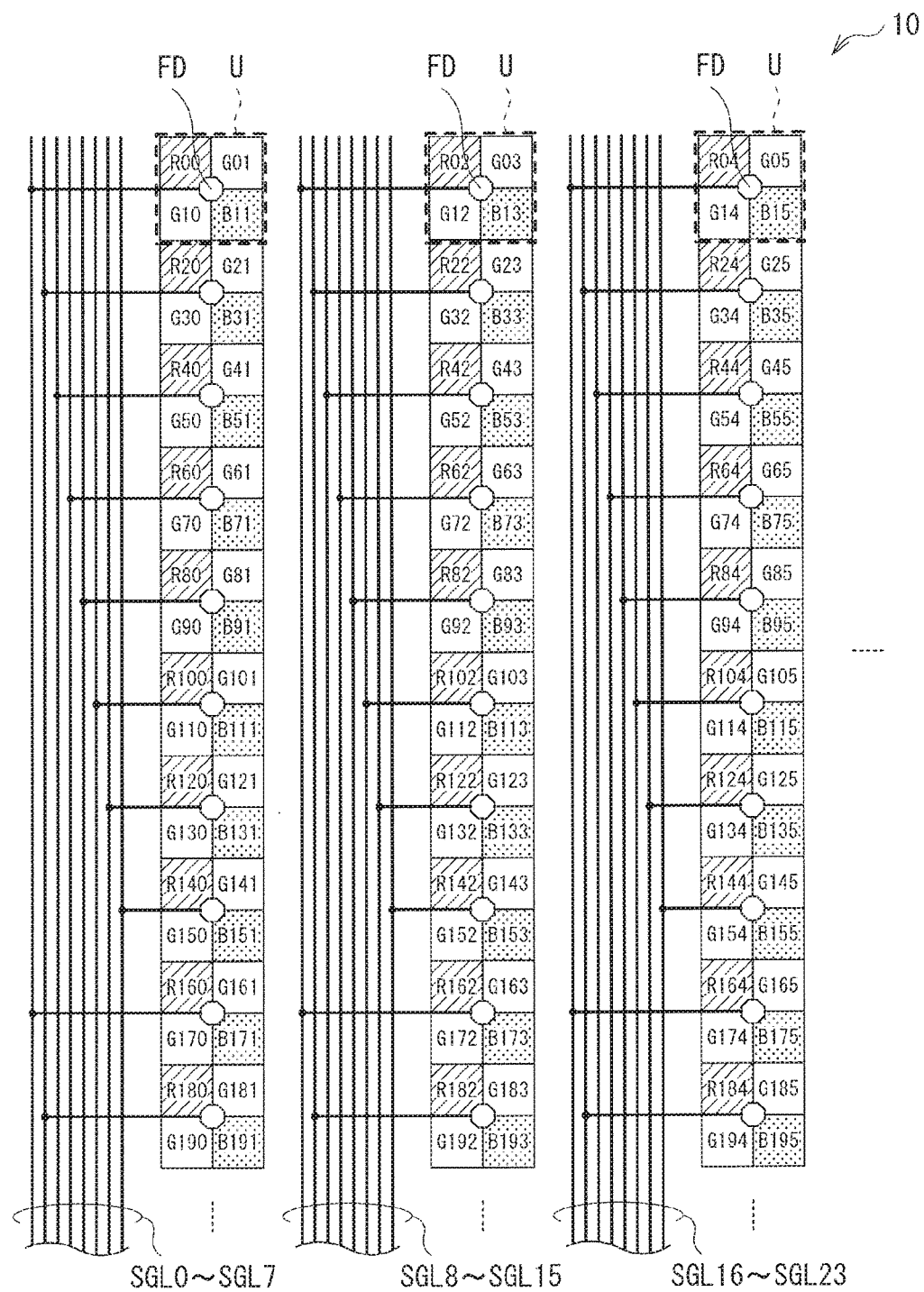

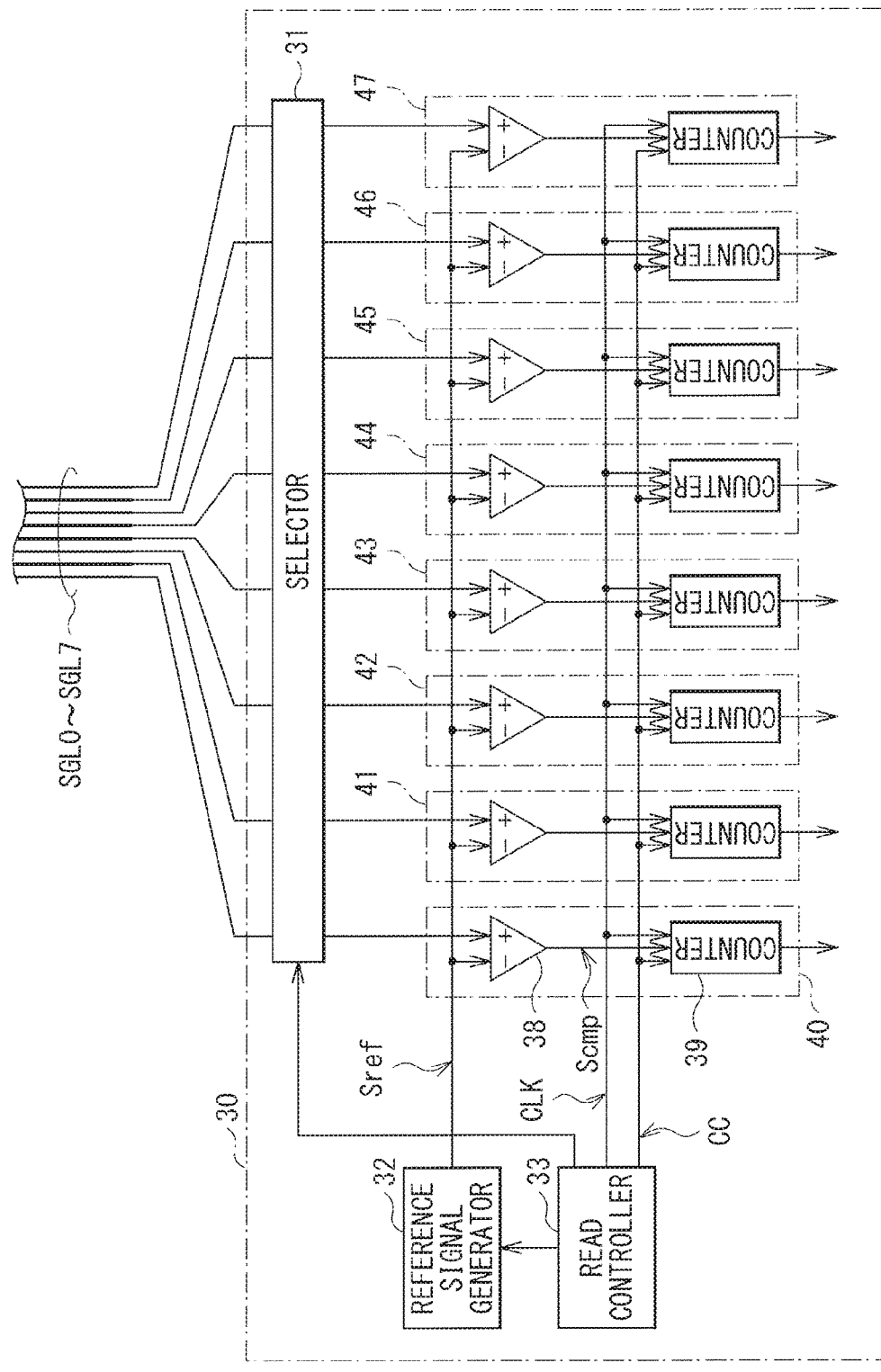
[FIG. 4]

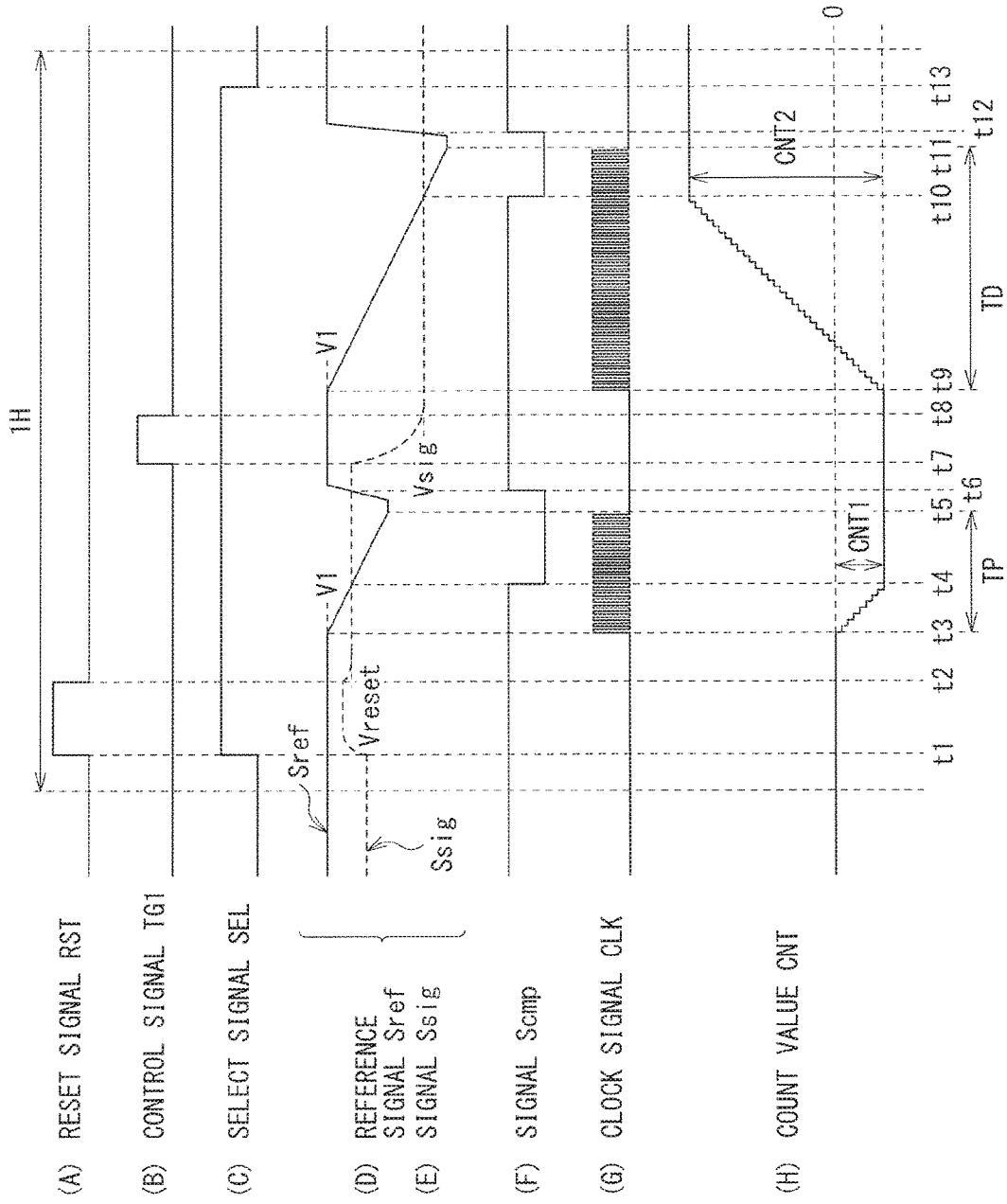

[FIG. 6]
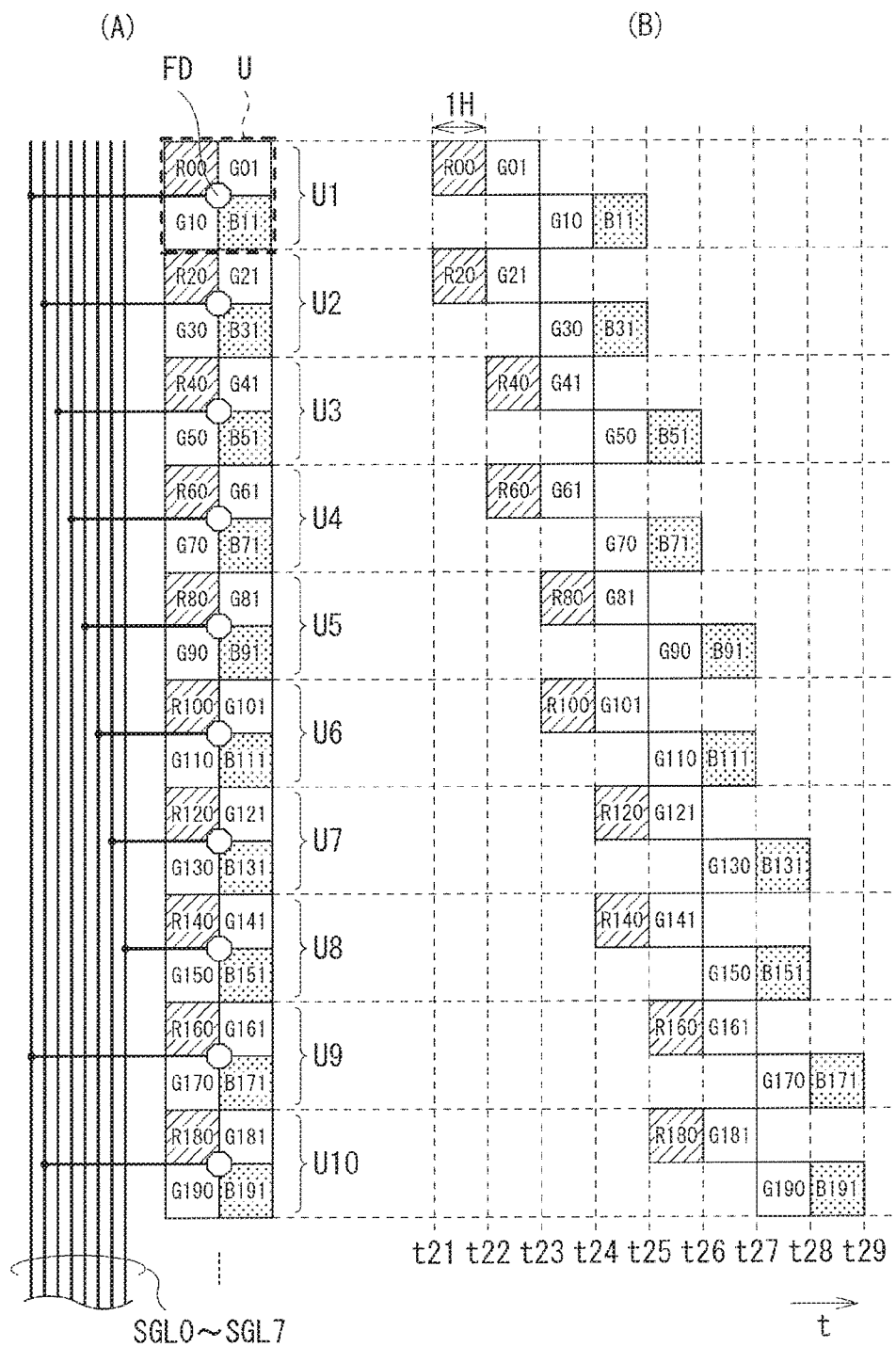

[ FIG. 7A ]
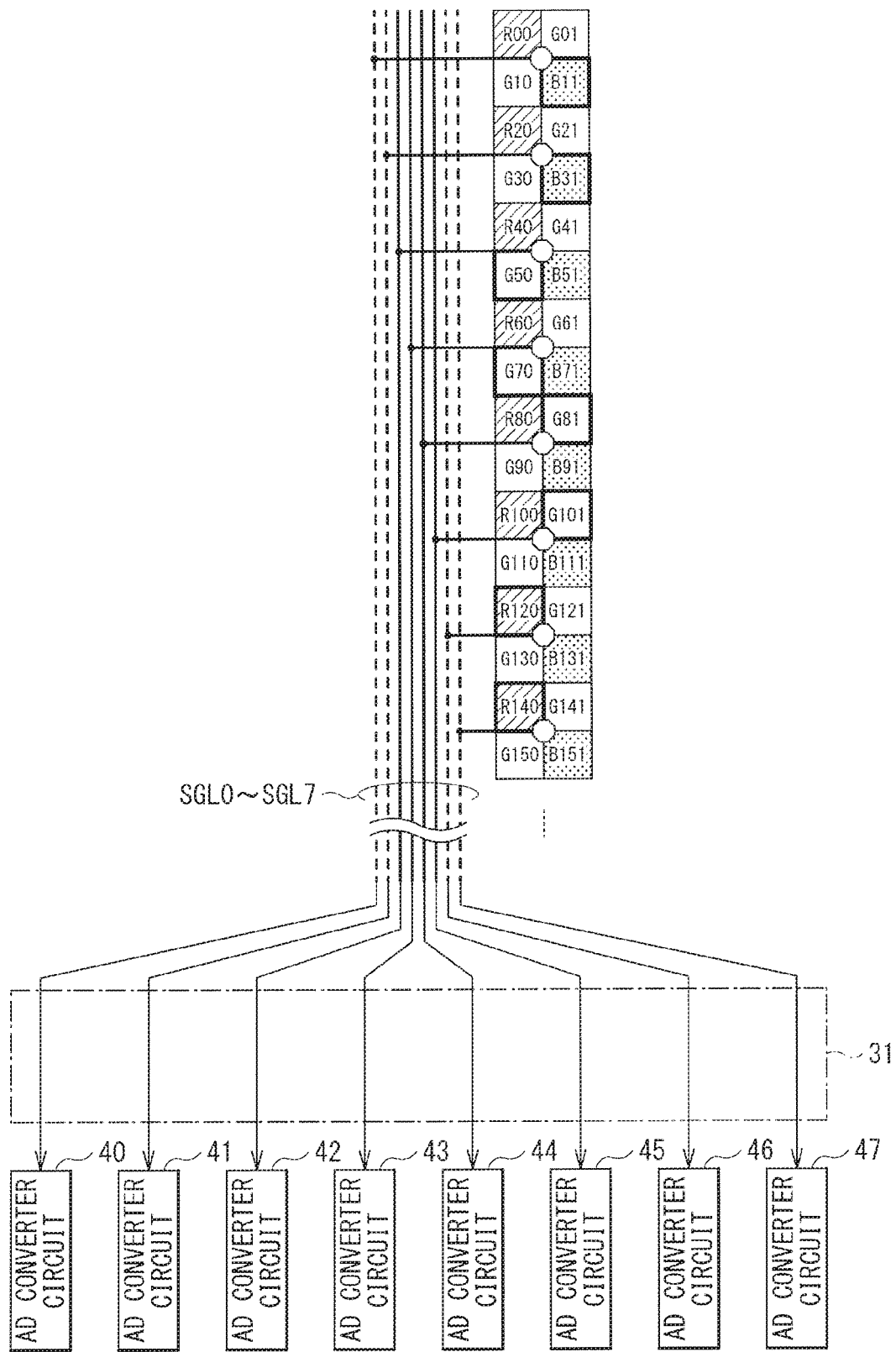

[FIG. 7B]
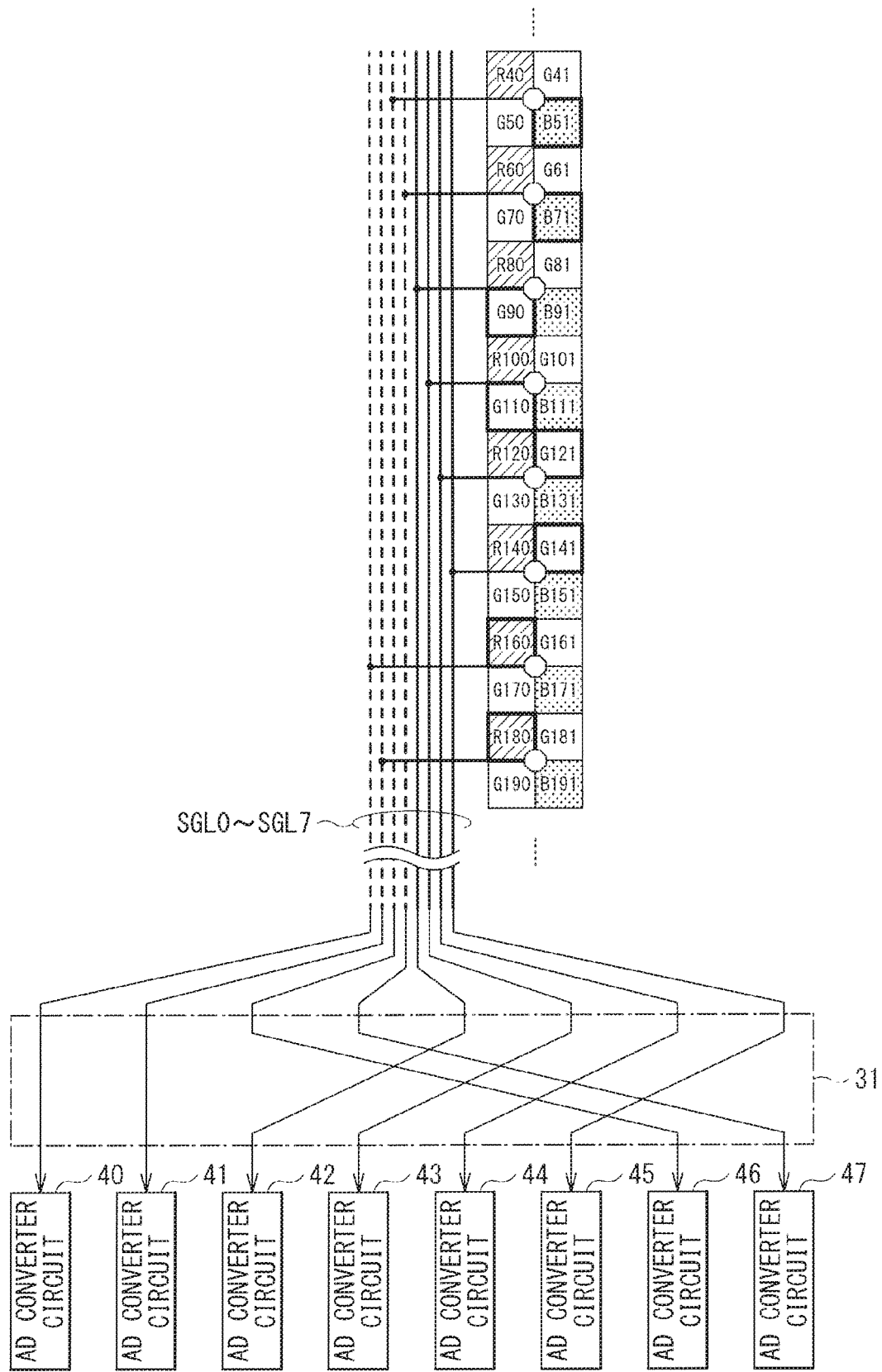

[ FIG. 7C ]
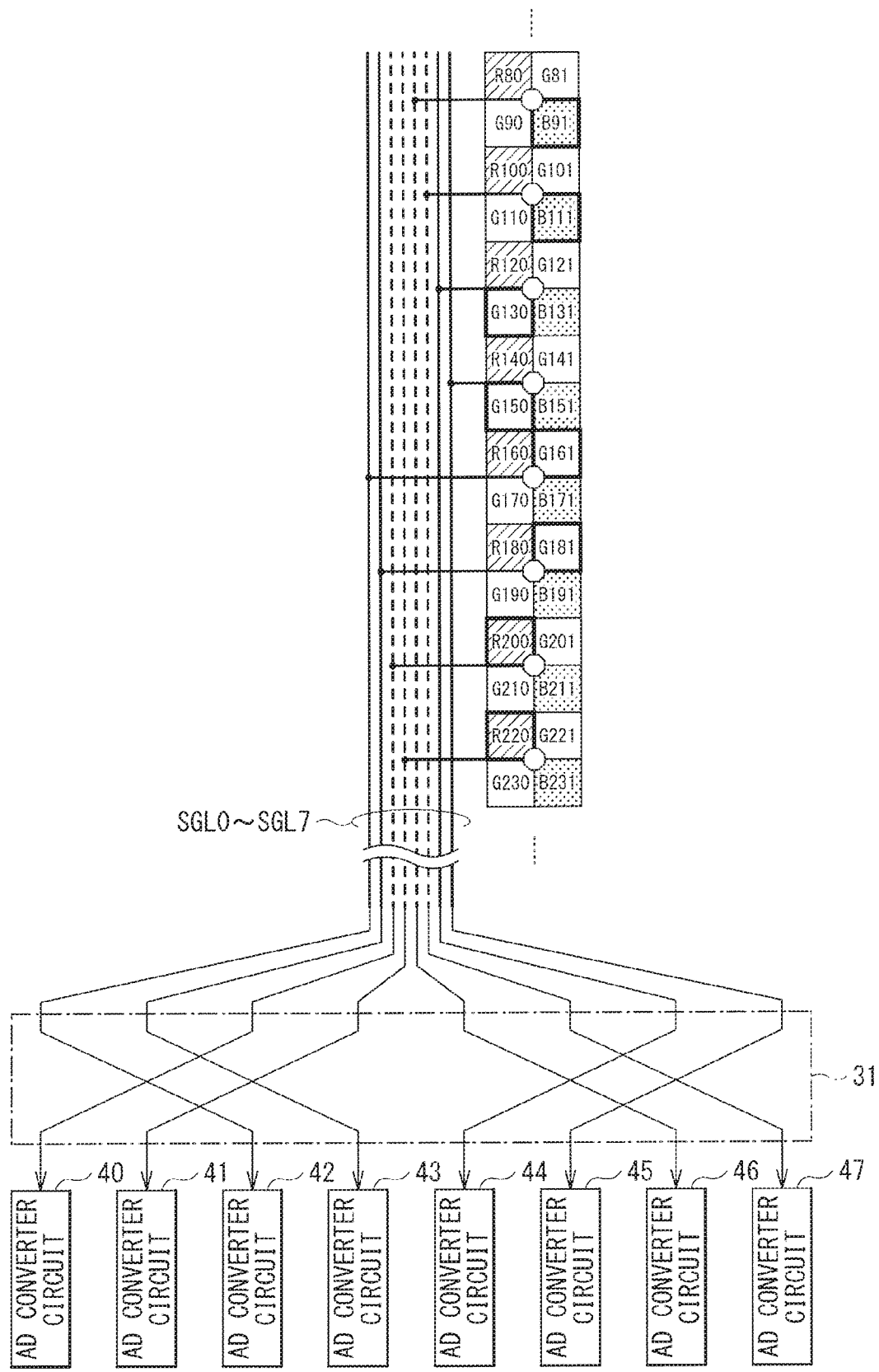

[FIG. 7D]
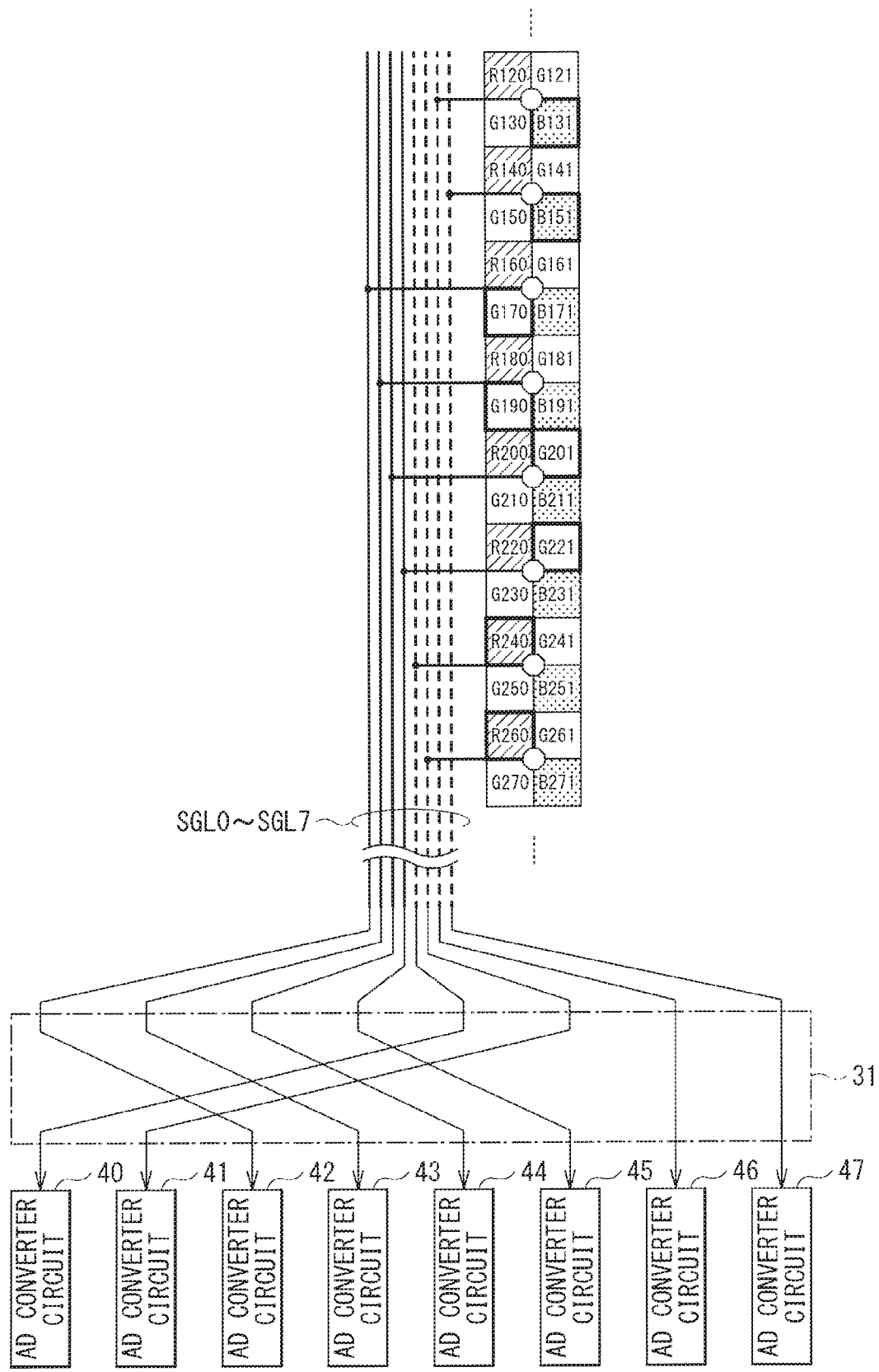

[FIG. 8]
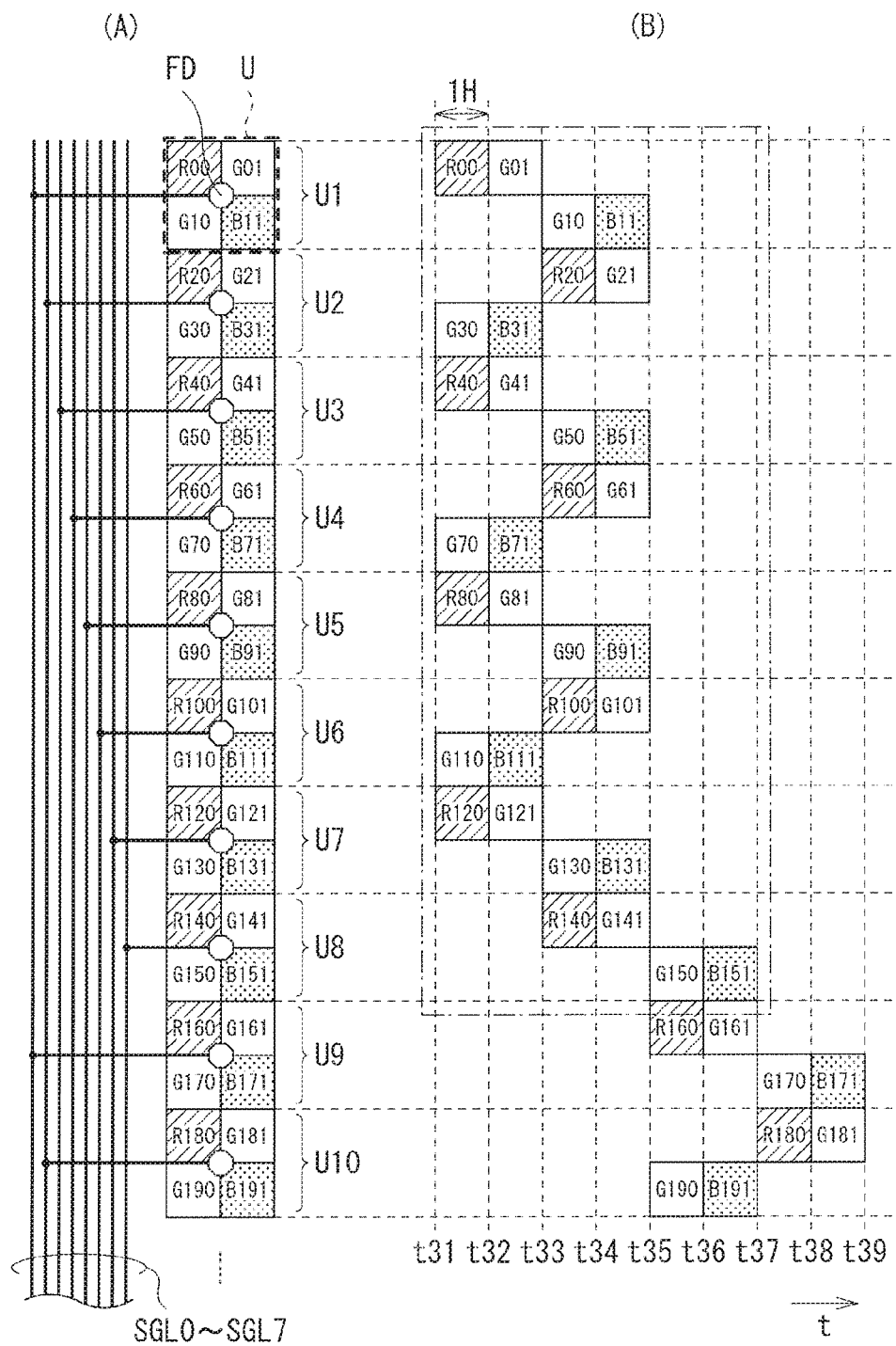

[ FIG. 9 ]
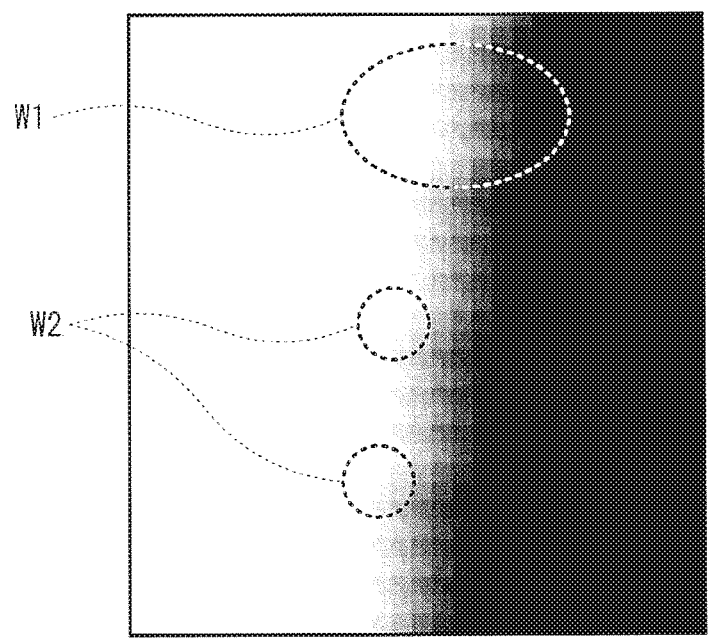
[ FIG. 10 ]
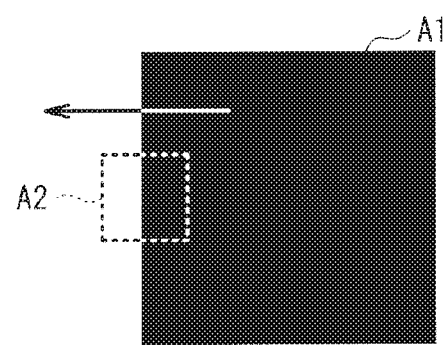

[ FIG. 11 ]
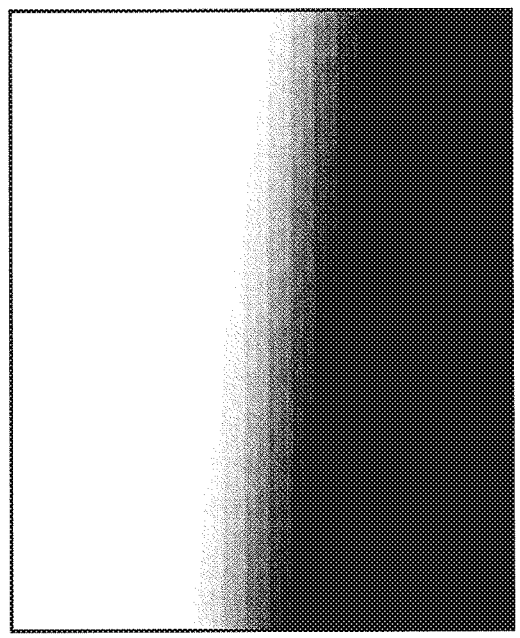

[ FIG. 12 ]
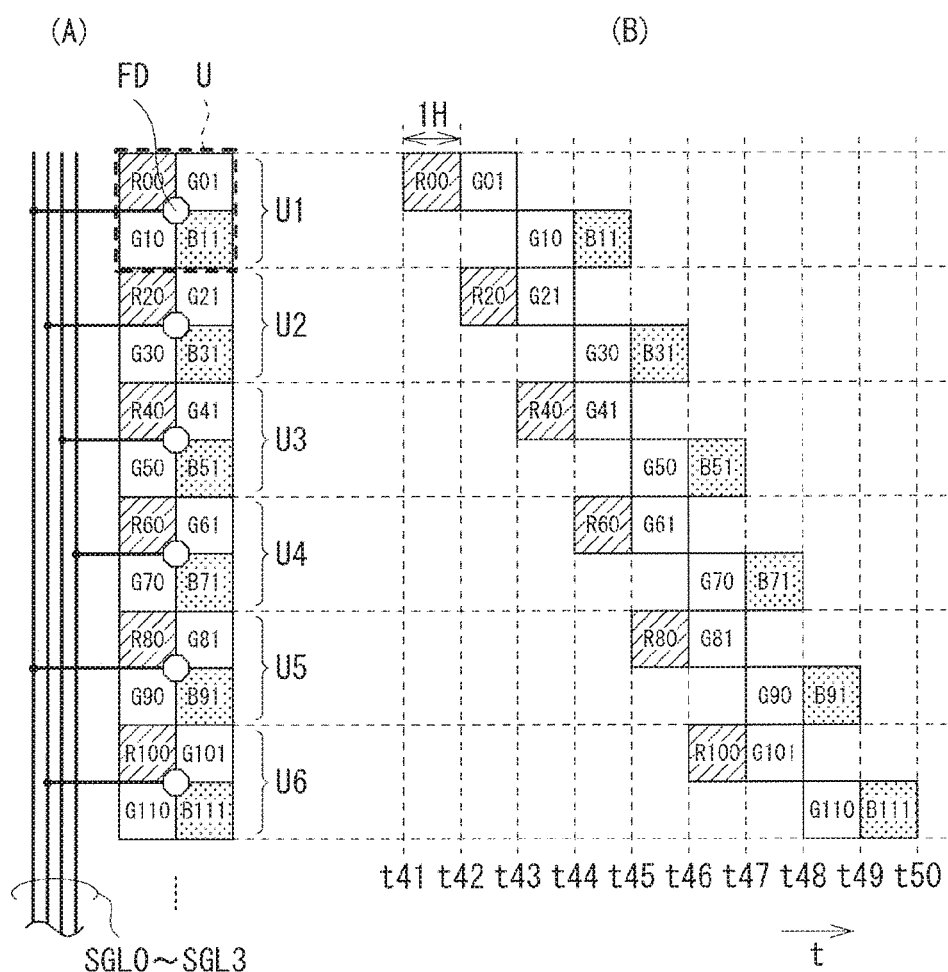

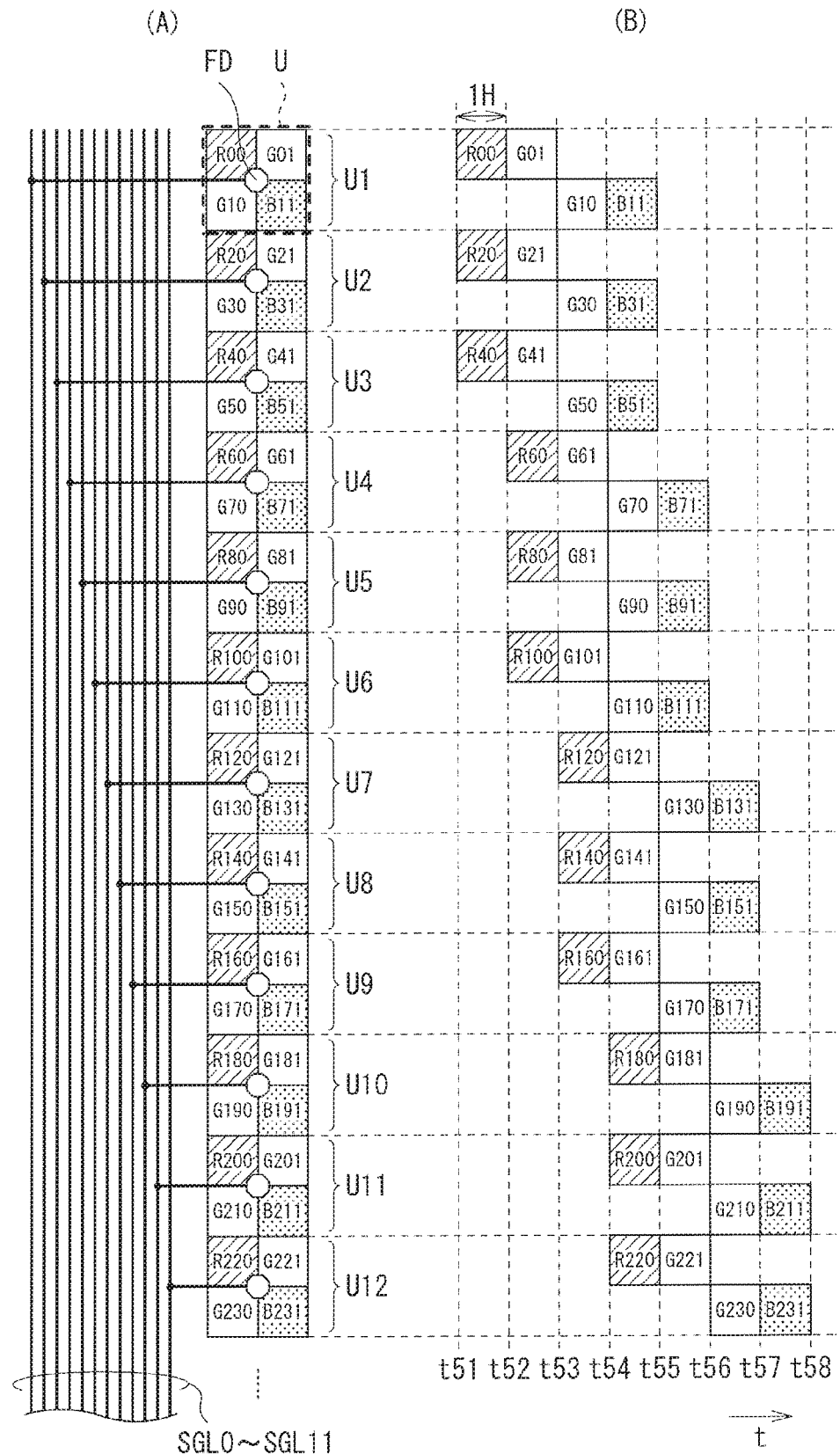
[FIG. 13]

[FIG. 14]
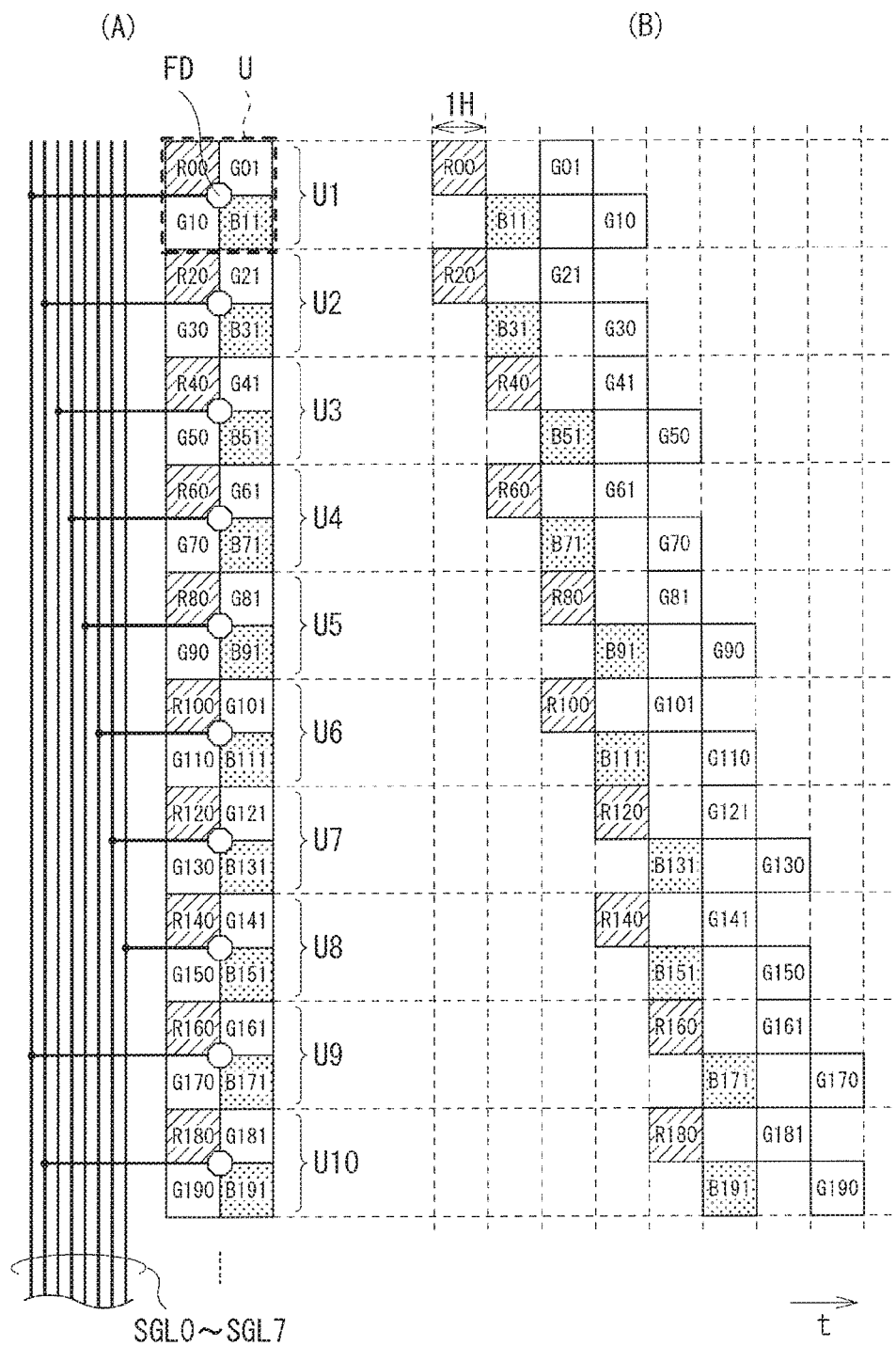

[ FIG. 15 ]
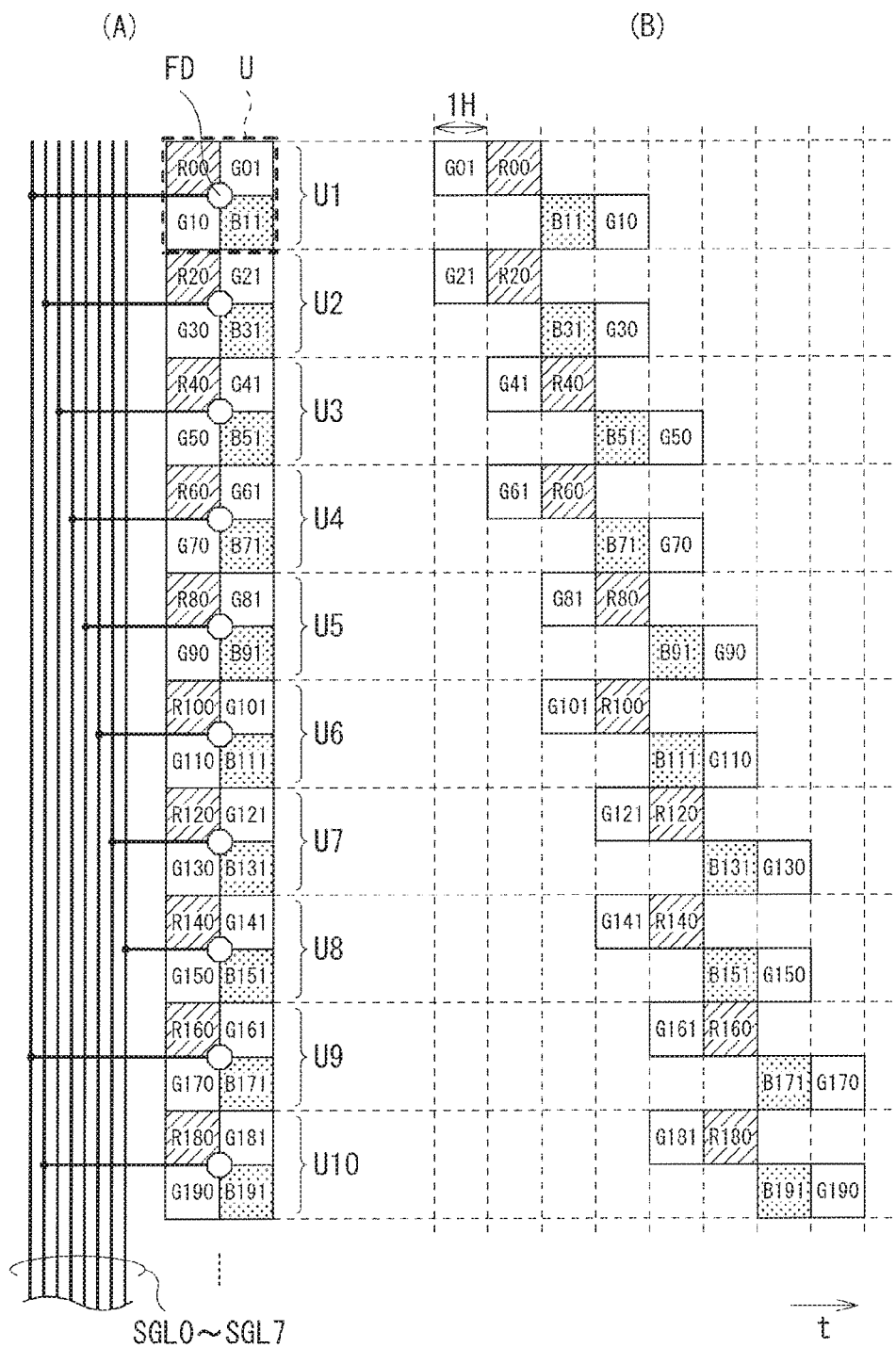

[ FIG. 16 ]
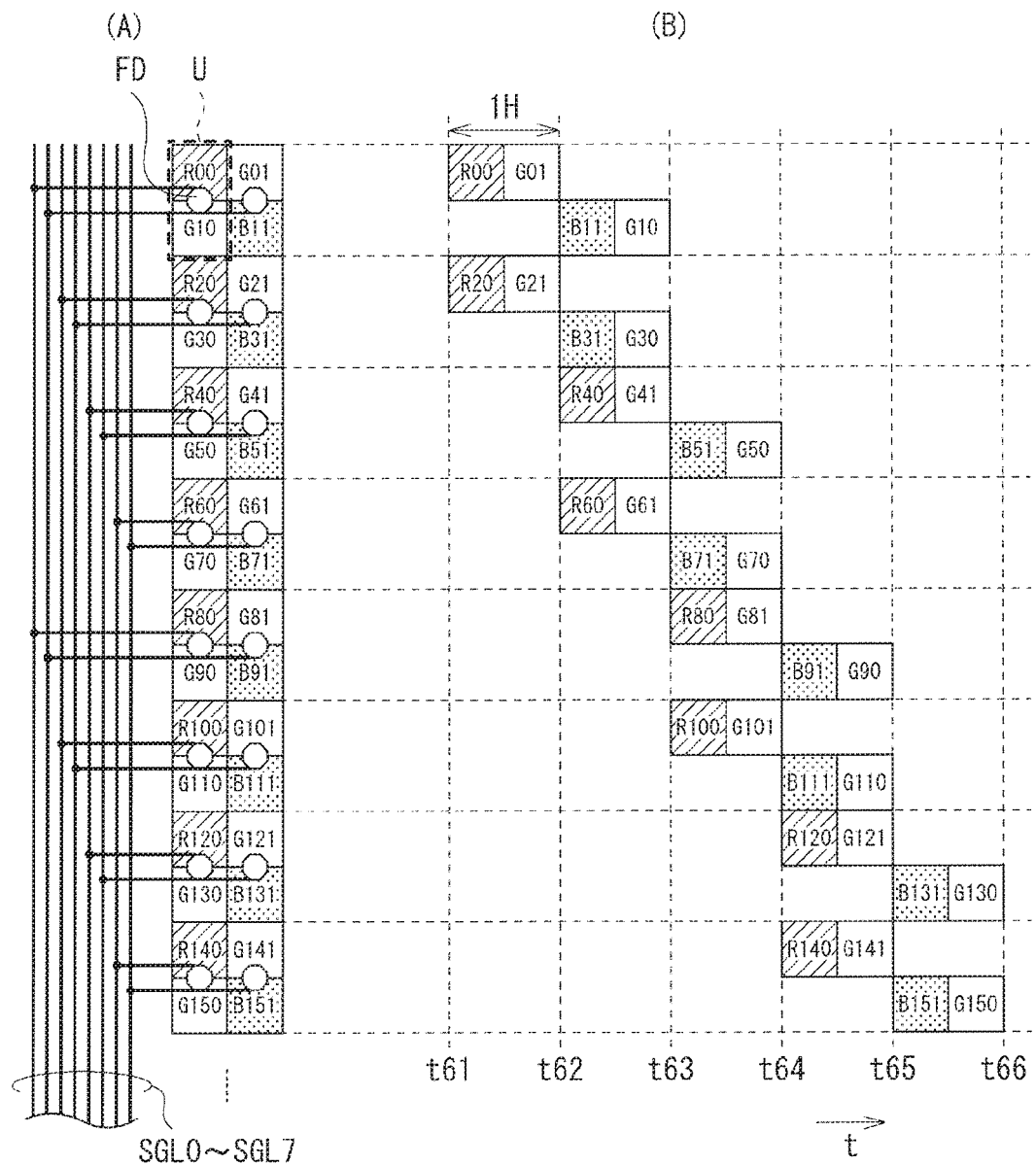

[FIG. 17]
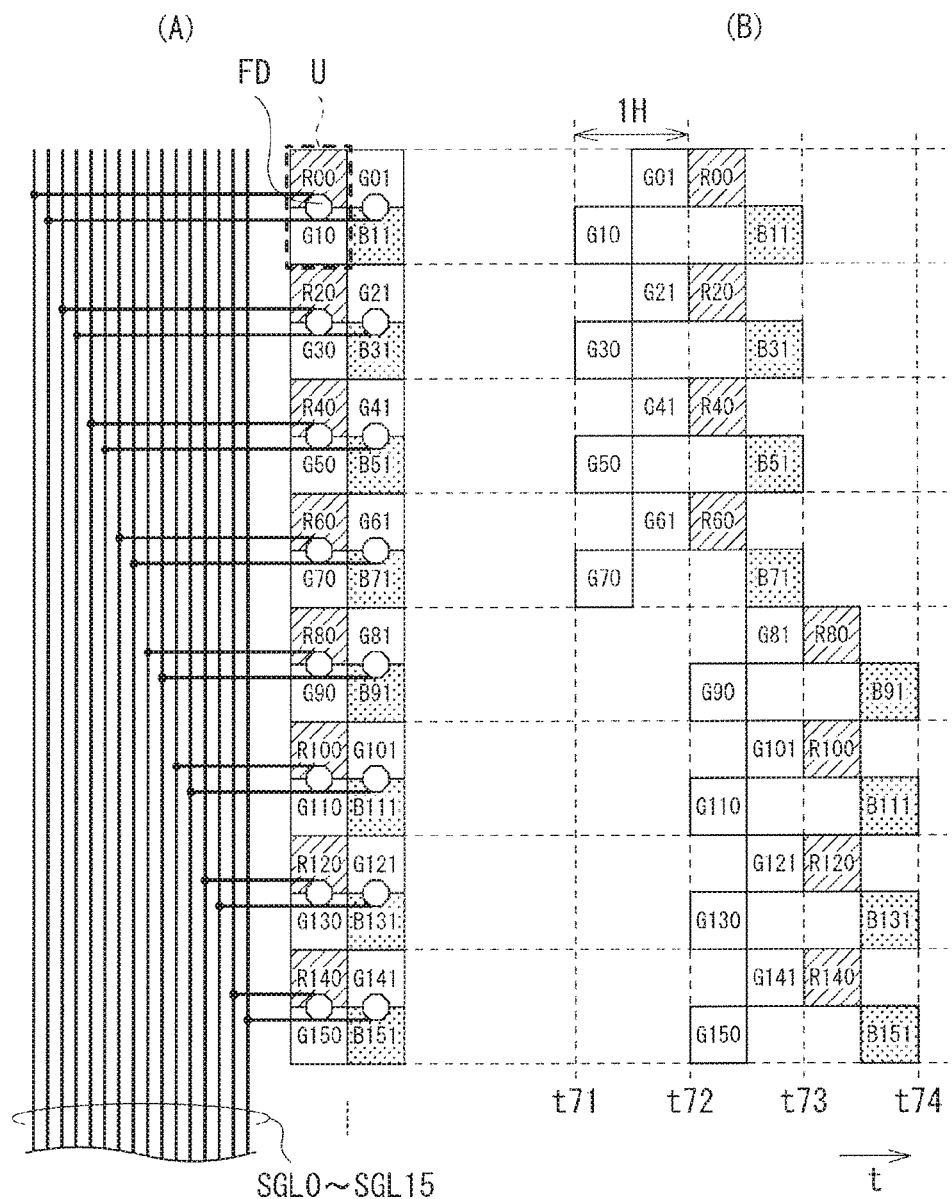

[ FIG. 18 ]
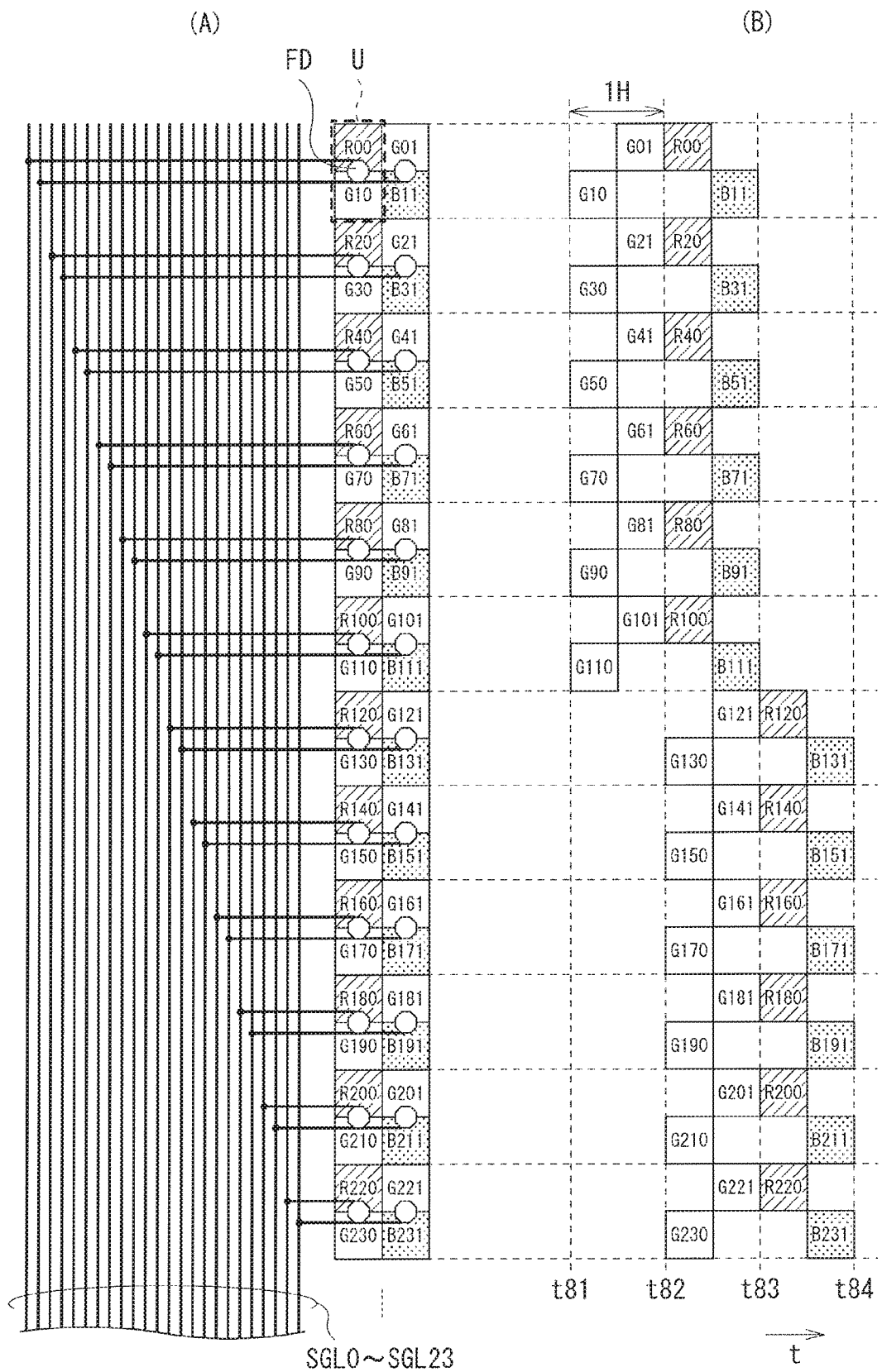

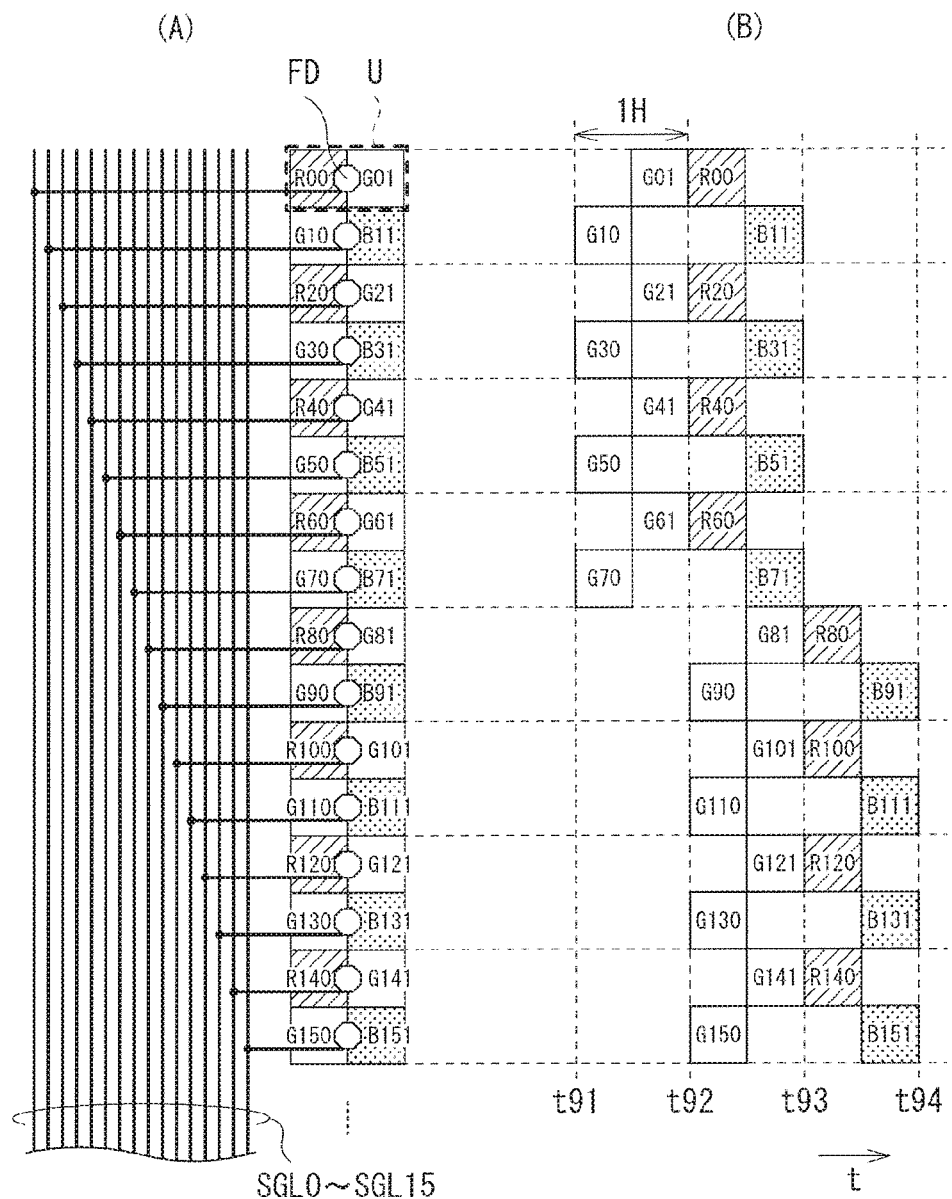
[FIG. 19]

[FIG. 20]
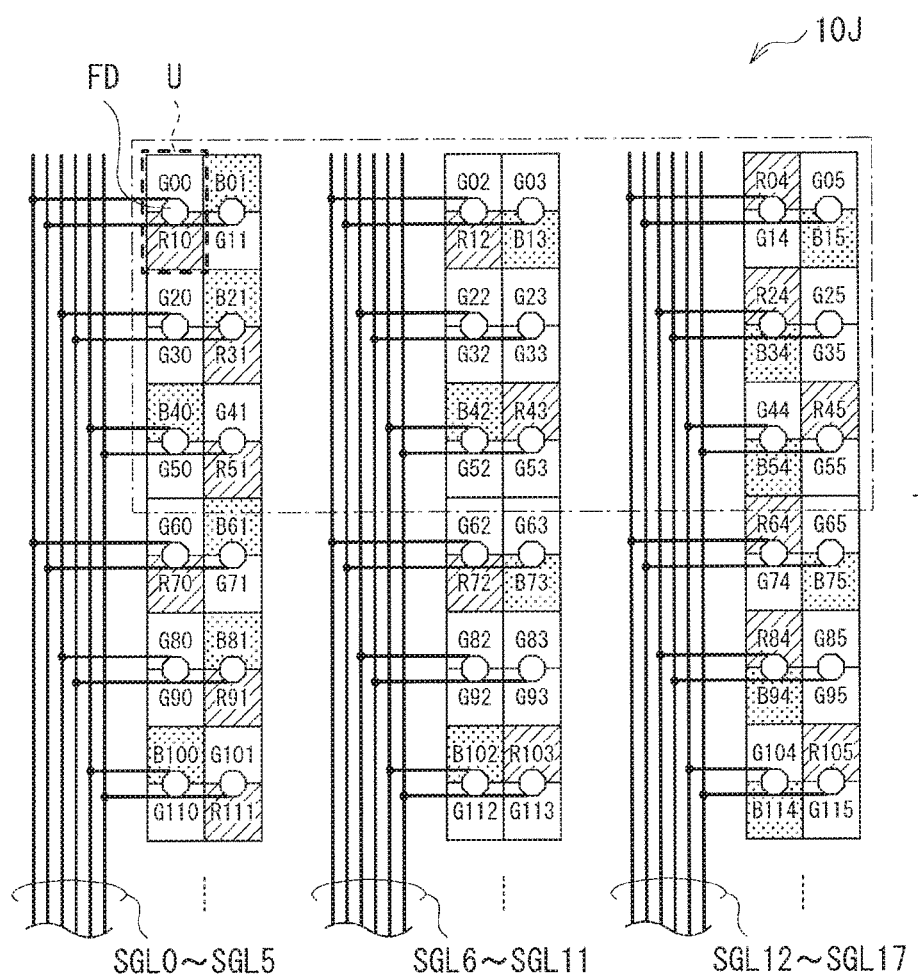

[ FIG. 21A ]
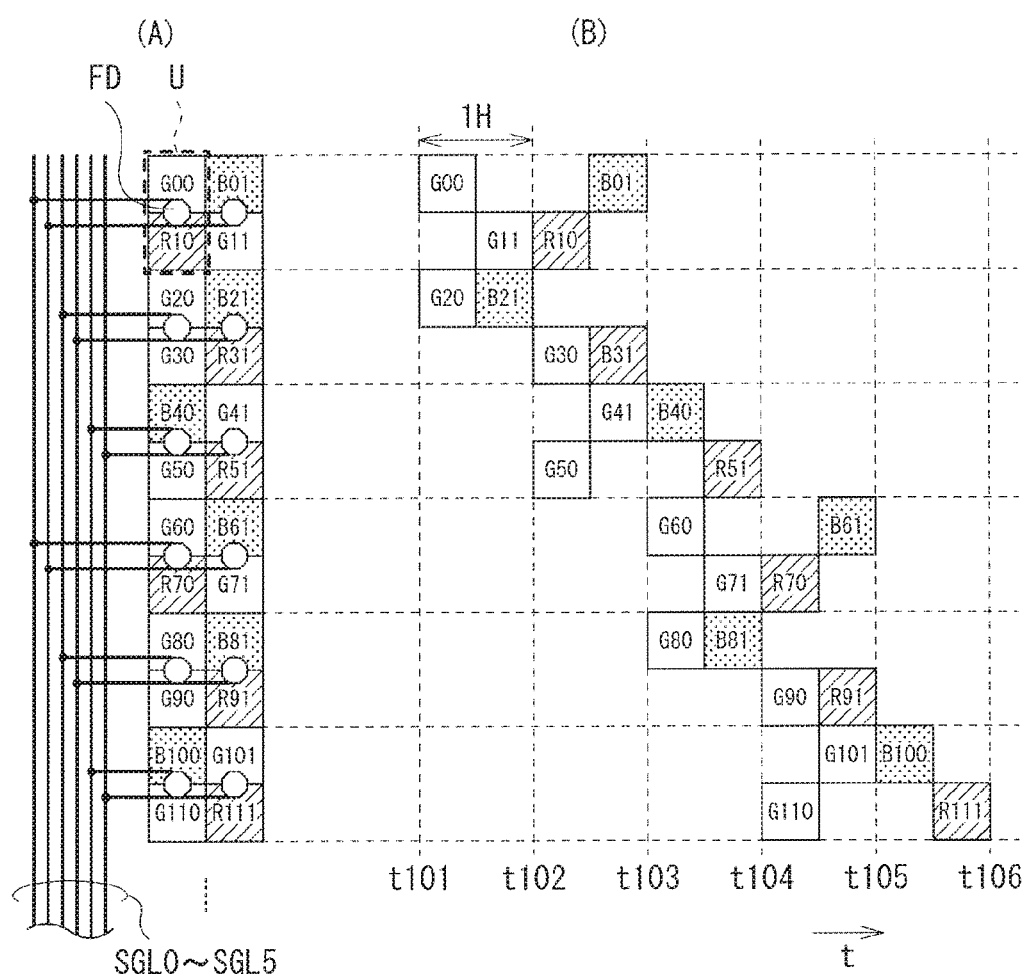

[ FIG. 21B ]
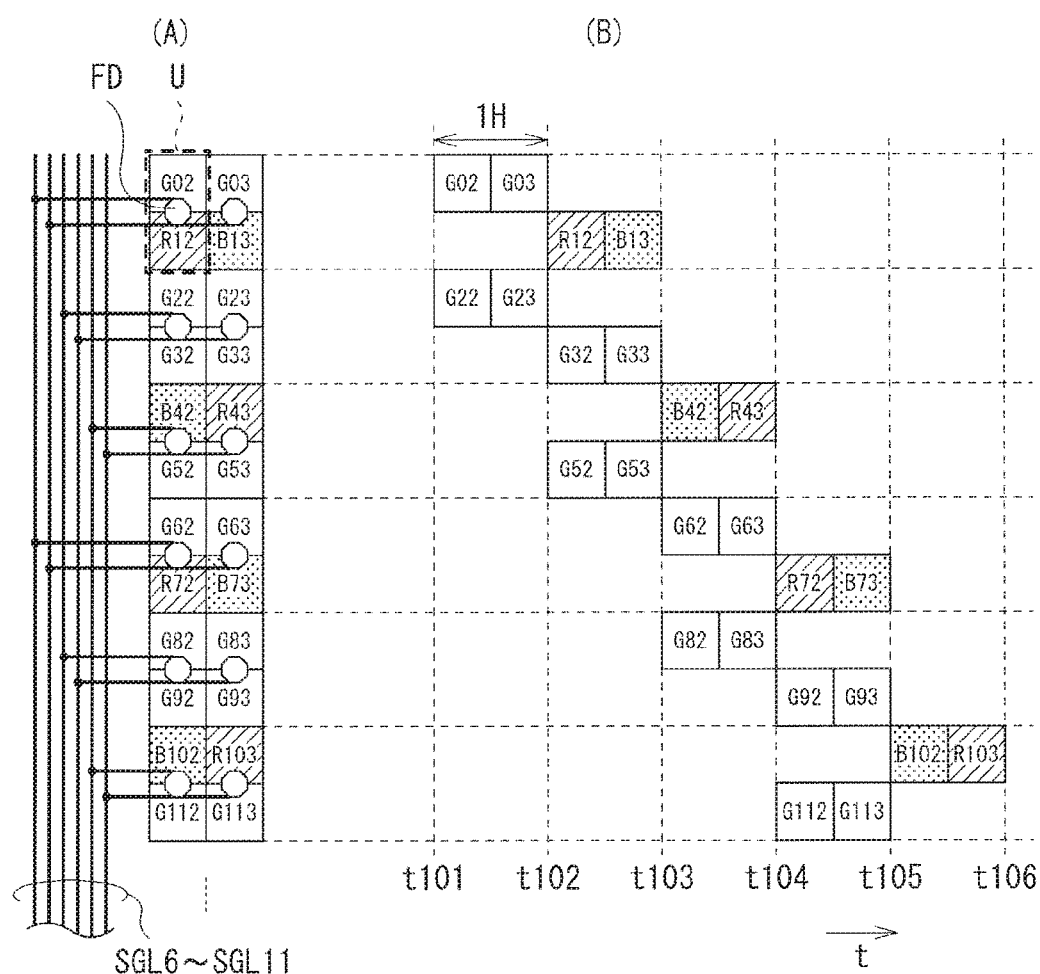

[ FIG. 21C ]
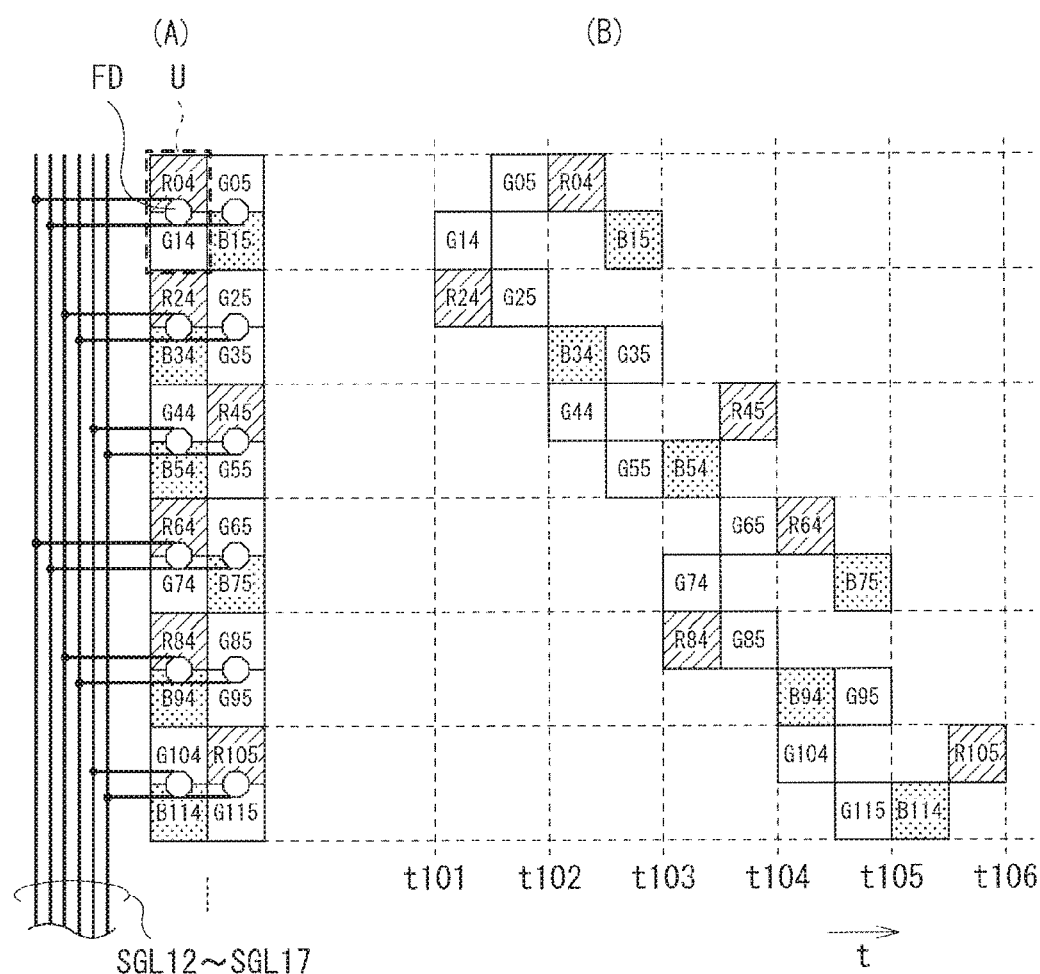

[ FIG. 22A ]
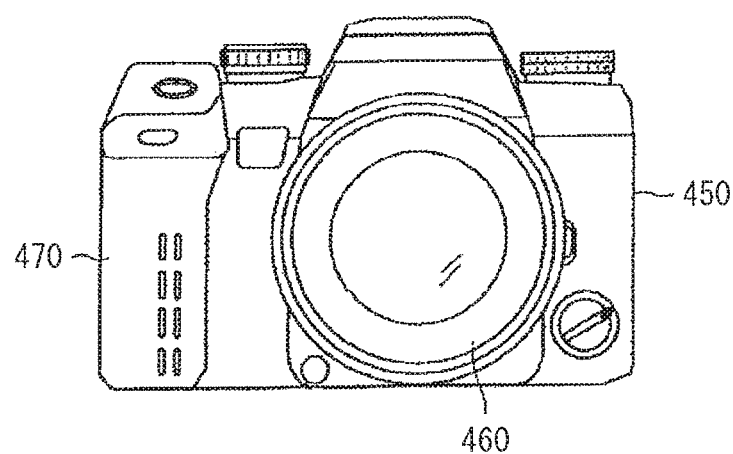
[ FIG. 22B ]
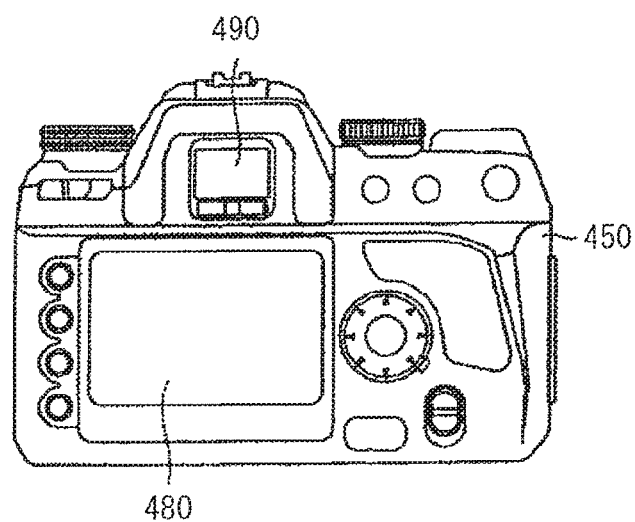

IMAGING DEVICE AND CONTROL METHOD THEREOF, AND ELECTRONIC APPARATUS

CROSS REFERENCE TO RELATED APPLICATIONS

This application is a U.S. National Phase of International Patent Application No. PCT/JP2015/082372 filed on Nov. 18, 2015, which claims priority benefit of Japanese Patent Application No. JP 2015-025024 filed in the Japan Patent Office on Feb. 12, 2015. Each of the above-referenced applications is hereby incorporated herein by reference in its entirety.

TECHNICAL FIELD

The disclosure relates to an imaging device suitable for, for example, color photography and a control method thereof, and an electronic apparatus including the imaging device.

BACKGROUND ART

In general, in imaging devices, pixels including photodetectors are disposed in a matrix. Each of the photodetectors generates an electrical signal in accordance with an amount of light received. Thereafter, for example, an AD converter circuit (Analog to Digital Converter) converts the electrical signal (an analog signal) generated in each pixel to a digital signal. Thereafter, the imaging device outputs the digital signals for one frame as imaging data. For example, PTLs 1 and 2 disclose imaging devices that include a plurality of AD converter circuits.

CITATION LIST

Patent Literature

PTL 1: Japanese Unexamined Patent Application Publication No. 2010-178033
PTL 2: Japanese Unexamined Patent Application Publication No. 2012-227827

SUMMARY OF THE INVENTION

Now, in the imaging devices, high image quality of captured images is desired, with expectation of further enhancement in image quality.

It is therefore desirable to provide an imaging device, a control method of an imaging device, and an electronic apparatus that make it possible to enhance image quality.

An imaging device according to an embodiment of the disclosure includes a plurality of pixel units and a controller. Each of the plurality of the pixel units includes a single read terminal and two or more pixels. The controller performs read operation with respect to each of the pixel units and starts, in each unit period, the read operation with respect to the predetermined number of the pixel units out of the plurality of the pixel units. The read operation includes sequentially reading pixel signals from the two or more pixels through the read terminal at a rate of one pixel every unit period.

A control method of an imaging device according to an embodiment of the disclosure includes: performing read operation with respect to each of a plurality of pixel units and starting, in each unit period, the read operation with respect to the predetermined number of the pixel units out of the plurality of the pixel units, in which each of the plurality of the pixel unit includes a single read terminal and two or more pixels, and the read operation includes sequentially reading pixel signals from the two or more pixels through the read terminal at a rate of one pixel every unit period; and generating captured image data on the basis of the pixel signals of the respective pixels.

An electronic apparatus according to an embodiment of the disclosure includes the imaging device as mentioned above. Examples include a digital camera, a smartphone, a tablet terminal, a video camera, and a notebook personal computer.

In the imaging device, the control method of the imaging device, and the electronic apparatus according to the embodiments of the disclosure, the read operation is performed with respect to each of the pixel units. The read operation includes sequentially reading the pixel signals from the two or more pixels at the rate of one pixel every unit period. Moreover, the read operation is started, in each unit period, with respect to the predetermined number of the pixel units out of the plurality of the pixel units.

According to the imaging device, the control method of the imaging device, and the electronic apparatus of the embodiments of the disclosure, the read operation is started, in each unit period, with respect to the predetermined number of the pixel units out of the plurality of the pixel units. Hence, it is possible to enhance image quality. It is to be noted that effects of the disclosure are not necessarily limited to the effects described above, and may include any of effects that are described herein.

BRIEF DESCRIPTION OF DRAWING

FIG. 1 is a block diagram that illustrates one configuration example of an imaging device according to one embodiment of the disclosure.

FIG. 2 is a circuit diagram that illustrates one configuration example of a pixel unit illustrated in FIG. 1.

FIG. 3 is a descriptive diagram that illustrates one configuration example of a pixel array illustrated in FIG. 1.

FIG. 4 is a block diagram that illustrates depiction of one configuration example of a reader illustrated in FIG. 1.

FIG. 5 is a timing waveform chart that illustrates one operation example of the imaging device illustrated in FIG. 1.

FIG. 6 is a timing chart that illustrates one operation example of the imaging device illustrated in FIG. 1.

FIG. 7A is a descriptive diagram that illustrates one state in the operation example of the imaging device illustrated in FIG. 1.

FIG. 7B is a descriptive diagram that illustrates another state in the operation example of the imaging device illustrated in FIG. 1.

FIG. 7C is a descriptive diagram that illustrates another state in the operation example of the imaging device illustrated in FIG. 1.

FIG. 7D is a descriptive diagram that illustrates another state in the operation example of the imaging device illustrated in FIG. 1.

FIG. 8 is a timing chart that illustrates one operation example of an imaging device according to a comparative example.

FIG. 9 is a descriptive diagram that illustrates one characteristic example of the imaging device illustrated in FIG. 8.

FIG. 10 is a descriptive diagram that illustrates one example of imaging conditions.

FIG. 11 is a descriptive diagram that illustrates one characteristic example of the imaging device illustrated in FIG. 1.

FIG. 12 is a timing chart that illustrates one operation example of an imaging device according to a modification example.

FIG. 13 is a timing chart that illustrates one operation example of an imaging device according to another modification example.

FIG. 14 is a timing chart that illustrates one operation example of an imaging device according to another modification example.

FIG. 15 is a timing chart that illustrates one operation example of an imaging device according to another modification example.

FIG. 16 is a timing chart that illustrates one operation example of an imaging device according to another modification example.

FIG. 17 is a timing chart that illustrates one operation example of an imaging device according to another modification example.

FIG. 18 is a timing chart that illustrates one operation example of an imaging device according to another modification example.

FIG. 19 is a timing chart that illustrates one operation example of an imaging device according to another modification example.

FIG. 20 is a descriptive diagram that illustrates one configuration example of a pixel array according to another modification example.

FIG. 21A is a timing chart that illustrates one operation example of an imaging device including the pixel array illustrated in FIG. 20.

FIG. 21B is another timing chart that illustrates one operation example of the imaging device including the pixel array illustrated in FIG. 20.

FIG. 21C is another timing chart that illustrates one operation example of the imaging device including the pixel array illustrated in FIG. 20.

FIG. 22A is a front view of an external appearance and a configuration of a digital camera to which the imaging device according to the embodiment is applied. [FIG. 22B] FIG. 22B is a rear view of the external appearance and the configuration of the digital camera to which the imaging device according to the embodiment is applied.

MODES FOR CARRYING OUT THE INVENTION

In the following, some embodiments of the disclosure are described in detail with reference to the drawings. It is to be noted that description is made in the following order.
1. Embodiment
2. Application Example 1. Embodiment Configuration Example FIG. 1 illustrates one configuration example of an imaging device (an imaging device 1) according to one embodiment. The imaging device 1 is an imaging device suitable for photography of color images (still images or moving images). It is to be noted that since a control method of an imaging device according to an embodiment of the disclosure is embodied by this embodiment, description thereof is made together. The imaging device 1 includes a pixel array 10 and an imaging controller 20.

The pixel array 10 includes a plurality of pixels R in a red color, a plurality of pixels G in a green color, and a plurality of pixels B in a blue color that are disposed in a matrix. Specifically, in this example, the plurality of the pixels R, G, and B are disposed in a so-called Bayer array pattern. In other words, in the pixel array 10, the pixels of two rows by two columns (a pixel unit U) are repeatedly disposed in a vertical direction (a longitudinal direction) and a horizontal direction (a lateral direction). In the pixel unit U, the pixel R in the red color (e.g., a pixel R00) is disposed on upper left. The pixels G in the green color (e.g., pixels G01 and G10) are disposed on upper right and on lower left. The pixel B in the blue color (e.g., a pixel B11) is disposed on lower right. Thus, the pixel array 10 includes the increased number of the pixels G in the green color that have high visibility, and thereby attains enhancement in image quality. The four pixels in the pixel unit U share a single floating diffusion FD, as described later.

FIG. 2 illustrates one configuration example of the pixel unit U. The pixel unit U includes photodiodes 11 and transistors 12 to 18.

The photodiodes 11 (11R, 11G1, 11G2, and 11B) are photoelectric conversion elements that generate charges in an amount corresponding to an amount of light received, and accumulates the charges in their insides. The photodiode 11R corresponds to the pixel R in the red color, and receives light that has passed through an undepicted color filter for the red color. The photodiode 11R includes an anode that is grounded, and a cathode coupled to a source of the transistor 12. The photodiodes 11G1 and 11G2 correspond the two pixels G in the green color, and receive light that has passed through undepicted color filters for the green color. The photodiode 11G1 includes an anode that is grounded, and a cathode coupled to a source of the transistor 13. The photodiode 11G2 includes an anode that is grounded, and a cathode coupled to a source of the transistor 14. The photodiode 11B corresponds to the pixel B in the blue color, and receives light that has passed through an undepicted color filter for the blue color. The photodiode 11B includes an anode that is grounded, and a cathode coupled to a source of the transistor 15.

The transistors 12 to 15 are, in this example, N type MOS (Metal Oxide Semiconductor) transistors. The transistor 12 includes a gate coupled to a control line CL1, the source coupled to the cathode of the photodiode 11R, and a drain coupled to the floating diffusion FD. The control line CL1 is supplied with a control signal TG1 by a scanner 22 (described later) of the imaging controller 20. The transistor 13 includes a gate coupled to a control line CL2, the source coupled to the cathode of the photodiode 11G1, and a drain coupled to the floating diffusion FD. The control line CL2 is supplied with a control signal TG2 by the scanner 22. The transistor 14 includes a gate coupled to a control line CL3, the source coupled to the cathode of the photodiode 11G2, and a drain coupled to the floating diffusion FD. The control line CL3 is supplied with a control signal TG3 by the scanner 22. The transistor 15 includes a gate coupled to a control line CL4, the source coupled to the cathode of the photodiode 11B, and a drain coupled to the floating diffusion FD. The control line CL4 is supplied with a control signal TG4 by the scanner 22.

With this configuration, in the pixel unit U, upon the transistor 12 being turned on, the charges generated in the photodiode 11R are transferred to the floating diffusion FD.

Upon the transistor 13 being turned on, the charges generated in the photodiode 11G1 are transferred to the floating diffusion FD. Upon the transistor 14 being turned on, the charges generated in the photodiode 11G2 are transferred to the floating diffusion FD. Upon the transistor 15 being turned on, the charges generated in the photodiode 11B are transferred to the floating diffusion FD.

The transistor 16 is, in this example, the N type MOS transistor, and includes a gate coupled to a reset control line RCL, a drain supplied with a power supply voltage VDD, and a source coupled to the floating diffusion FD and coupled to a gate of the transistor 17. The reset control line RCL is supplied with a reset signal RST by the scanner 22 (described later) of the imaging controller 20.

With this configuration, in the pixel unit U, prior to the charge transfer to the floating diffusion FD from the photodiodes 11 (11R, 11G1, 11G2, and 11B), the transistor 16 is turned on. This causes the floating diffusion FD to be supplied with the power supply voltage VDD, causing a reset of a voltage of the floating diffusion FD (reset operation).

The transistors 17 and 18 are, in this example, the N type MOS transistors. The transistor 17 includes the gate coupled to the floating diffusion FD, a drain supplied with the power supply voltage VDD, and a source coupled to a drain of the transistor 18. The transistor 18 includes a gate coupled to a select line SL, the drain coupled to the source of the transistor 17, and a source coupled to a signal line SGL. The select line SL is supplied with a select signal SEL by the scanner 22 (described later) of the imaging controller 20.

With this configuration, in the imaging device 1, the transistor 18 is turned on, causing the transistor 17 to output a signal Ssig to the signal line SGL through the transistor 18. The signal Ssig corresponds to a potential of the floating diffusion FD. Specifically, in a P phase (a Pre-charge phase) term TP after the reset of the voltage of the floating diffusion FD, the transistor 17 outputs, as the signal Ssig, a voltage Vreset that corresponds to the potential of the floating diffusion FD at the occasion. Moreover, in a D phase (a Data phase) term TD after the charge transfer to the floating diffusion FD from the photodiodes 11 (11R, 11G1, 11G2, and 11B), the transistor 17 outputs, as the signal Ssig, a voltage Vsig that corresponds to the potential of the floating diffusion FD at the occasion.

FIG. 3 illustrates one configuration example of the pixel array 10. In the pixel array 10, the signal lines SGL are provided at a rate of eight for the pixels R, G, and B of the two columns. Specifically, for example, the pixels R, G, and B of the 0th column and the 1st column from the left are coupled to any one of the eight signal lines SGL0 to SGL7. In this example, the four pixels R00, G01, G10, and B11 that constitute the single pixel unit U are coupled to the signal line SGL0. Likewise, the four pixels R20, G21, G30, and B31 are coupled to the signal line SGL1. The four pixels R40, G41, G50, and B51 are coupled to the signal line SGL2. The four pixels R60, G61, G70, and B71 are coupled to the signal line SGL3. The four pixels R80, G81, G90, and B91 are coupled to the signal line SGL4. The four pixels R100, G101, G110, and B111 are coupled to the signal line SGL5. The four pixels R120, G121, G130, and B131 are coupled to the signal line SGL6. The four pixels R140, G141, G150, and B151 are coupled to the signal line SGL7. This repeats itself afterwards. That is, for example, the four pixels R160, G161, G170, and B171 are coupled to the signal line SGL0. For example, the four pixels R180, G181, G190, and B191 are coupled to the signal line SGL1.

Likewise, for example, the pixels R, G, and B of the 2nd column and the 3rd column from the left are coupled to any one of the eight signal lines SGL8 to SGL15. In this example, for example, the four pixels R02, G03, G12, and B13 that constitute the single pixel unit U are coupled to the signal line SGL8. The four pixels R22, G23, G32, and B33 are coupled to the signal line SGL9. Moreover, the pixels R, G, and B of the 4th column and the 5th column from the left are coupled to any one of the eight signal lines SGL16 to SGL23. In this example, for example, the four pixels R04, G05, G14, and B15 that constitute the single pixel unit U are coupled to the signal line SGL16. The four pixels R24, G25, G34, and B35 are coupled to the signal line SGL17. The same applies to the pixels R, G, and B of the other columns.

The imaging controller 20 (FIG. 1) controls operation of the pixel array 10, and generates an image signal Spic including captured image data, on the basis of the signal Ssig supplied from the pixel array 10. The imaging controller 20 includes a timing controller 21, the scanner 22, and a reader 30.

The timing controller 21 supplies a control signal to each part of the imaging controller 20, to control them to operate in synchronization with one another.

The scanner 22 selects, on the basis of the control signal supplied from the timing controller 21, each of the pixels R, G, and B of the pixel array 10 in units of the rows (in units of pixel lines). The scanner 22 is so constituted as to include, for example, a shift register and an address decoder. Specifically, the scanner 22 supplies the reset signal RST to the reset control lines RCL of the pixel array 10, supplies the control signals TG1 to TG4 respectively to the control lines CL1 to CL4, and supplies the select signal SEL to the select lines SL. Thus, the scanner 22 selects each of the pixels R, G, and B of the pixel array 10, in units of the rows (in units of the pixel lines).

The reader 30 generates the image signal Spic including the captured image data, on the basis of the signal Ssig supplied from the selected pixels R, G, and B through the signal lines SGL, and on the basis of the control signal supplied from the timing controller 21.

FIG. 4 illustrates one configuration example of the reader 30. FIG. 4 provides depiction of a part of the reader 30 regarding the signal lines SGL0 to SGL7. The reader 30 includes a selector 31, a reference signal generator 32, AD converter circuits 40 to 47, and a read controller 33.

The selector 31 forms coupling between the signal lines SGL0 to SGL7 and the AD converter circuits 40 to 47, on the basis of a control signal supplied from the read controller 33.

The reference signal generator 32 generates a reference signal Sref on the basis of the control signal supplied from the read controller 33. In this example, the reference signal Sref has a so-called ramp waveform in which a voltage level gradually lowers in accordance with passage of time, in the P phase term TP and the D phase term TD. The reference signal generator 32 generates the reference signal Sref as mentioned above, and supplies the reference signal Sref to the AD converter circuits 40 to 47.

The AD converter circuits 40 to 47 perform AD conversion on the basis of the signal Ssig (the voltage Vreset and the voltage Vsig) supplied from the pixel array 10. Each of the AD converter circuits 40 to 47 includes a comparator 38 and a counter 39.

The comparator 38 makes a comparison of an input voltage at a positive input terminal with an input voltage at a negative input terminal, and outputs a result of the comparison as a signal Scmp. The positive input terminal of the comparator 38 is coupled to any one of the signal lines SGL0 to SGL7 through the selector 31, and is supplied with the signal Ssig. Moreover, the negative input terminal of the comparator 38 is supplied with the reference signal Sref.

The counter 39 performs count-up operation or count-down operation, on the basis of the signal Scmp, and on the basis of a control signal CC and a clock signal CLK supplied from the read controller 33. Specifically, as described later, in the P phase term TP, the counter 39 starts the count-down operation on the basis of the control signal CC, and suspends the count-down operation on the basis of the output signal Scmp of the comparator 38. Moreover, in the D phase term TD, the counter 39 starts the count-up operation on the basis of the control signal CC, and suspends the count-up operation on the basis of the output signal Scmp of the comparator 38. Furthermore, the counter 39 outputs a final count value after the D phase term TD.

With this configuration, as described later, the reader 30 performs AD conversion of the voltage Vsig while performing AD conversion of the voltage Vreset, and obtains a pixel value PV of the relevant pixel on the basis of a difference between results of the AD conversion. Moreover, the reader 30 generates the image signal Spic including the captured image data, on the basis of the pixel value PV. In the imaging device 1, performing such a correlation double sampling makes it possible to remove a noise component included in the voltage Vsig. As a result, in the imaging device 1, it is possible to enhance image quality of a captured image.

The read controller 33 supplies the control signal to the reference signal generator 32, and generates the clock signal CLK and the control signal CC to supply them to the AD converter circuits 40 to 47, on the basis of an instruction from the timing controller 21.

Here, for example, the pixels R, G, and B of the two columns correspond to one specific example of a plurality of pixels that belong to a "plurality of pixel units" in the disclosure. The imaging controller 20 corresponds to one specific example of a "controller" in the disclosure. The voltage Vsig corresponds to one specific example of a "pixel signal" in the disclosure. One horizontal period (1H) corresponds to one specific example of a "unit period" in the disclosure. The AD converter circuits 40 to 47 correspond to one specific example of a "plurality of read circuits" in the disclosure.

[Operation and Workings]

Description is given next of operation and workings of the imaging device 1 according to this embodiment.

[Outline of Overall Operation]

First, description is given on an outline of overall operation of the imaging device 1, with reference to the figures such as FIG. 1. The scanner 22 selects each of the pixels R, G, and B of the pixel array 10 in units of the rows. The selected pixels R, G, and B output the voltage Vreset as the signal Ssig in the P phase term TP, and output the voltage Vsig as the signal Ssig in the D phase term TD. The reader 30 performs the AD conversion of the voltage Vsig while performing the AD conversion of the voltage Vreset, and obtains the pixel value PV at the relevant pixel on the basis of the difference between the results of the AD conversion. Moreover, the reader 30 generates the image signal Spic including the captured image data, on the basis of the pixel value PV.

[Detailed Operation]

Detailed description is given next of operation in a case where the AD converter circuit 40 obtains the pixel value PV related to the pixel R.

FIG. 5 illustrates one operation example of the imaging device 1, with (A) indicating a waveform of the reset signal RST, with (B) indicating a waveform of the control signal TG1, with (C) indicating a waveform of the select signal SEL, with (D) indicating a waveform of a reference signal Sref, with (E) indicating a waveform of the signal Ssig, with (F) indicating a waveform of the output signal Scmp of the comparator 38 of the AD converter circuit 40, with (G) indicating a waveform of the clock signal CLK, and with (H) indicating a count value CNT in the counter 39 of the AD converter circuit 40. Here, in (D) and (E) of FIG. 5, the waveforms of the respective signals are represented on the same voltage axis.

In the imaging device 1, in a certain horizontal period (1H), first, the scanner 22 performs the reset operation with respect to the pixel unit U including the pixel R. In the P phase term TP thereafter, the AD converter circuit 40 performs the AD conversion on the basis of the voltage Vreset outputted by the relevant pixel unit U. Moreover, the scanner 22 selects the pixel R of the pixel unit U, and the AD converter circuit 40 performs, in the D phase term TD, the AD conversion on the basis of the voltage Vsig outputted by the pixel unit U. In what follows, this operation is described in detail.

First, at timing t1, the scanner 22 changes a voltage of the reset signal RST from a low level to a high level ((A) of FIG. 5). Thus, in the pixel unit U including the pixel R, the transistor 16 is turned on. As a result, the voltage of the floating diffusion FD is set as the power supply voltage VDD, causing the reset of the voltage of the floating diffusion FD. Moreover, at the same time, the scanner 22 changes a voltage of the select signal SEL from the low level to the high level ((C) of FIG. 5). Thus, in the pixel unit U, the transistor 18 is turned on, causing the pixel unit U to be coupled to the signal line SGL.

Thereafter, at timing t2, the scanner 22 changes the voltage of the reset signal RST from the high level to the low level ((A) of FIG. 5). Thus, in the pixel unit U, the transistor 16 is turned off. Moreover, at and after the timing t2, the pixel unit U outputs the voltage Vreset that corresponds to the potential of the floating diffusion FD at the occasion.

Thereafter, in a period of timing t3 to t5 (the P phase term TP), the reader 30 performs the AD conversion on the basis of the voltage Vreset. Specifically, first, at the timing t3, the read controller 33 starts generation of the clock signal CLK ((G) of FIG. 5). At the same time, the reference signal generator 32 starts, on the basis of the control signal supplied from the read controller 33, to lower a voltage of the reference signal Sref from a voltage V1 at a predetermined rate of change ((D) of FIG. 5). In accordance with this, thereafter, the counter 39 of the AD converter circuit 40 performs the count-down operation, and lowers the count value CNT successively ((H) of FIG. 5).

Thereafter, at timing t4, the voltage of the reference signal Sref becomes lower than the voltage Vreset of the signal Ssig ((D) and (E) of FIG. 5). In accordance with this, the comparator 38 of the AD converter circuit 40 changes a voltage of the output signal Scmp from the high level to the low level ((F) of FIG. 5). As a result, the counter 39 suspends the count-down operation ((H) of FIG. 5). In this way, the AD converter circuit 40 converts the voltage Vreset to a digital value (CNT1).

Thereafter, at the timing t5, the read controller 33 suspends the generation of the clock signal CLK ((G) of FIG. 5). At the same time, the reference signal generator 32 suspends a change in the voltage of the reference signal Sref, on the basis of the control signal supplied from the read controller 33. Thereafter, the reference signal generator 32 restores the voltage of the reference signal Sref to the voltage V1 ((D) of FIG. 5). At this occasion, at timing t6, the voltage of the reference signal Sref becomes higher than the voltage Vreset of the signal Ssig ((D) and (E) of FIG. 5). In accordance with this, the comparator 38 of the AD converter circuit 40 changes the voltage of the signal Scmp from the low level to the high level ((F) of FIG. 5).

Thereafter, at timing t7, the scanner 22 changes a voltage of the control signal TG1 from the low level to the high level ((B) of FIG. 5). Thus, in the pixel unit U including the pixel R of interest, the transistor 12 is turned on. As a result, the charges generated in the photodiode 11R are transferred to the floating diffusion FD. In accordance with this, the voltage of the signal Ssig gradually lowers ((E) of FIG. 5).

Thereafter, at timing t8, the scanner 22 changes the voltage of the control signal TG1 from the high level to the low level ((B) of FIG. 5). Thus, in the pixel unit U, the transistor 12 is turned off. Moreover, at and after the timing t8, the pixel unit U outputs the voltage Vsig that corresponds to the potential of the floating diffusion FD at this occasion.

Thereafter, in a period of timing t9 to t11 (the D phase term TD), the reader 30 performs the AD conversion on the basis of the voltage Vsig. Specifically, first, at the timing t9, the read controller 33 starts the generation of the clock signal CLK ((G) of FIG. 5). At the same time, the reference signal generator 32 starts, on the basis of the control signal supplied from the read controller 33, to lower the voltage of the reference signal Sref from the voltage V1 at the predetermined rate of change ((D) of FIG. 5). In accordance with this, thereafter, the counter 39 of the AD converter circuit 40 performs the count-up operation, and allows the count value CNT to increase successively ((H) of FIG. 5).

Thereafter, at timing t10, the voltage of the reference signal Sref becomes lower than the voltage Vsig of the signal Ssig ((D) and (E) of FIG. 5). In accordance with this, the comparator 38 of the AD converter circuit 40 changes the voltage of the signal Scmp from the high level to the low level ((F) of FIG. 5). As a result, the counter 39 suspends the count-up operation ((H) of FIG. 5). In this way, the AD converter circuit 40 converts the voltage Vsig to a digital value (a count value CNT2). Thereafter, the AD converter circuit 40 outputs the count value CNT (CNT2−CNT1).

Thereafter, at the timing t11, the read controller 33 suspends the generation of the clock signal CLK ((G) of FIG. 5). At the same time, the reference signal generator 32 suspends the change in the voltage of the reference signal Sref, on the basis of the control signal supplied from the read controller 33. Thereafter, the reference signal generator 32 restores the voltage of the reference signal Sref to the voltage V1 ((D) of FIG. 5). At this occasion, at timing t12, the voltage of the reference signal Sref becomes higher than the voltage Vsig of the signal Ssig ((D) and (E) of FIG. 5). In accordance with this, the comparator 38 of the AD converter circuit 40 changes the voltage of the signal Scmp from the low level to the high level ((F) of FIG. 5).

Thereafter, at timing t13, the scanner 22 changes the voltage of the select signal SEL from the high level to the low level ((C) of FIG. 5). Thus, in the pixel unit U, the transistor 18 is turned off, causing the pixel unit U to be separated from the signal line SGL.

As described, in the imaging device 1, the AD conversion of the voltage Vreset is performed to acquire the digital value (the count value CNT1), while the AD conversion of the voltage Vsig is performed to acquire the digital value (the count value CNT2). Thus, the difference between the digital values (CNT2−CNT1) is obtained. In the imaging device 1, as described, performing the correlation double sampling makes it possible to remove the noise component included in the voltage Vsig. As a result, it is possible to enhance the image quality of the captured image.

Moreover, in the imaging device 1, the counter 39 is provided that performs the count-down operation and the count-up operation. This makes it unnecessary to provide, for example, a calculator that obtains the difference between the two count values CNT1 and CNT2. Hence, it is possible to simplify a circuit configuration.

As illustrated in FIG. 5, in the single horizontal period (1H), the imaging device 1 obtains the pixel value PV (read operation) related to the single pixel (the pixel R in this example) in the certain pixel unit U. Moreover, thereafter, the imaging device 1 continuously performs the read operation successively with respect to the remaining three pixels in the relevant pixel unit U. In the following, description is given on the read operation in the imaging device 1, with the pixels R, G, and B of the 0th column and the 1st column given as an example.

FIG. 6 illustrates one example of the read operation in the imaging device 1, with (A) illustrating an arrangement of the pixels R, G, and B of the 0th column and the 1st column together with the eight signal lines SGL0 to SGL7, and with (B) illustrating the read operation with respect to the pixels R, G, and B. FIGS. 7A to 7D illustrate one operation example of the selector 31.

At timing t21, the imaging controller 20 starts the read operation with respect to the four pixels R00, G01, G10, and B11 (a pixel unit U1), and with respect to the four pixels R20, G21, G30, and B31 (a pixel unit U2). Moreover, in a period of timing t21 to t25, the imaging controller 20 performs the read operation with respect to the four pixels R00, G01, G10, and B11 in the pixel unit U1 in this order, while performing the read operation with respect to the four pixels R20, G21, G30, and B31 in the pixel unit U2 in this order. Specifically, for example, the imaging controller 20 performs the read operation simultaneously with respect to the pixels R00 and R20 in the single horizontal period (1H) of the timing t21 to t22, performs the read operation simultaneously with respect to the pixels G01 and G21 in the single horizontal period (1H) of the timing t22 to t23, performs the read operation simultaneously with respect to the pixels G10 and G30 in the single horizontal period (1H) of the timing t23 to t24, and performs the read operation simultaneously with respect to the pixels B11 and B31 in the single horizontal period (1H) of the timing t24 to t25.

Moreover, at the timing t22, the imaging controller 20 starts the read operation with respect to the four pixels R40, G41, G50, and B51 (a pixel unit U3), and with respect to the four pixels R60, G61, G70, and B71 (a pixel unit U4). Moreover, in a period of the timing t22 to t26, the imaging controller 20 performs the read operation with respect to the four pixels R40, G41, G50, and B51 in the pixel unit U3 in this order, while performing the read operation with respect to the four pixels R60, G61, G70, and B71 in the pixel unit U4 in this order.

Moreover, at the timing t23, the imaging controller 20 starts the read operation with respect to the four pixels R80, G81, G90, and B91 (a pixel unit U5), and with respect to the four pixels R100, G101, G110, and B111 (a pixel unit U6). Moreover, in a period of the timing t23 to t27, the imaging controller 20 performs the read operation with respect to the four pixels R80, G81, G90, and B91 in the pixel unit U5 in this order, while performing the read operation with respect to the four pixels R100, G101, G110, and B111 in the pixel unit U6 in this order.

Moreover, at the timing t24, the imaging controller 20 starts the read operation with respect to the four pixels R120, G121, G130, and B131 (a pixel unit U7), and with respect to the four pixels R140, G141, G150, and B151 (a pixel unit U8). Moreover, in a period of the timing t24 to t28, the imaging controller 20 performs the read operation with respect to the four pixels R120, G121, G130, and B131 in the pixel unit U7 in this order, while performing the read operation with respect to the four pixels R140, G141, G150, and B151 in the pixel unit U8 in this order.

Moreover, at the timing t25, the imaging controller 20 starts the read operation with respect to the four pixels R160, G161, G170, and B171 (a pixel unit U9), and with respect to the four pixels R180, G181, G190, and B191 (a pixel unit U10). Moreover, in a period of the timing t25 to t29, the imaging controller 20 performs the read operation with respect to the four pixels R160, G161, G170, and B171 in the pixel unit U9 in this order, while performing the read operation with respect to the four pixels R180, G181, G190, and B191 in the pixel unit U10 in this order.

The same applies to the other pixels R, G, and B.

As illustrated in (B) of FIG. 6, for example, in the single horizontal period (1H) of the timing t24 to t25, the read operation is performed with respect to the eight pixels B11, B31, G50, G70, G81, G101, R120, and R140. At this occasion, as illustrated in FIG. 7A, the signal lines SGL2 to SGL5 denoted by solid lines respectively transmit the signals Ssig related to the pixels G50, G70, G81, and G101 in the green color. The signal lines SGL0, SGL1, SGL6, and SGL7 denoted by broken lines respectively transmit the signals Ssig related to the pixels B11 and B31 in the blue color and the pixels R120 and R140 in the red color. The selector 31, as illustrated in FIG. 7A, couples the signal line SGL0 to the AD converter circuit 40, couples the signal line SGL1 to the AD converter circuit 41, couples the signal line SGL2 to the AD converter circuit 42, couples the signal line SGL3 to the AD converter circuit 43, couples the signal line SGL4 to the AD converter circuit 44, couples the signal line SGL5 to the AD converter circuit 45, couples the signal line SGL6 to the AD converter circuit 46, and couples the signal line SGL7 to the AD converter circuit 47. Thus, the AD converter circuit 40 receives, through the signal line SGL0, the signal Ssig related to the pixel B11 in the blue color. The AD converter circuit 41 receives, through the signal line SGL1, the signal Ssig related to the pixel B31 in the blue color. The AD converter circuit 42 receives, through the signal line SGL2, the signal Ssig related to the pixel G50 in the green color. The AD converter circuit 43 receives, through the signal line SGL3, the signal Ssig related to the pixel G70 in the green color. The AD converter circuit 44 receives, through the signal line SGL4, the signal Ssig related to the pixel G81 in the green color. The AD converter circuit 45 receives, through the signal line SGL5, the signal Ssig related to the pixel G101 in the green color. The AD converter circuit 46 receives, through the signal line SGL6, the signal Ssig related to the pixel R120 in the red color. The AD converter circuit 47 receives, through the signal line SGL7, the signal Ssig related to the pixel R140 in the red color.

Likewise, for example, in the single horizontal period (1H) of the timing t25 to t26, the read operation is performed with respect to the eight pixels B51, B71, G90, G110, G121, G141, R160, and R180. At this occasion, as illustrated in FIG. 7B, the signal lines SGL4 to SGL7 (the solid lines) respectively transmit the signals Ssig related to the pixels G90, G110, G121, and G141 in the green color. The signal lines SGL0 to SGL3 (the broken lines) respectively transmit the signals Ssig related to the pixels R160 and R180 in the red color and the pixels B51 and B71 in the blue color. The selector 31, as illustrated in FIG. 7B, couples the signal line SGL0 to the AD converter circuit 40, couples the signal line SGL1 to the AD converter circuit 41, couples the signal line SGL2 to the AD converter circuit 46, couples the signal line SGL3 to the AD converter circuit 47, couples the signal line SGL4 to the AD converter circuit 42, couples the signal line SGL5 to the AD converter circuit 43, couples the signal line SGL6 to the AD converter circuit 44, and couples the signal line SGL7 to the AD converter circuit 45. Thus, the AD converter circuit 40 receives, through the signal line SGL0, the signal Ssig related to the pixel R160 in the red color. The AD converter circuit 41 receives, through the signal line SGL1, the signal Ssig related to the pixel R180 in the red color. The AD converter circuit 42 receives, through the signal line SGL4, the signal Ssig related to the pixel G90 in the green color. The AD converter circuit 43 receives, through the signal line SGL5, the signal Ssig related to the pixel G101 in the green color. The AD converter circuit 44 receives, through the signal line SGL6, the signal Ssig related to the pixel G121 in the green color. The AD converter circuit 45 receives, through the signal line SGL7, the signal Ssig related to the pixel G141 in the green color. The AD converter circuit 46 receives, through the signal line SGL2, the signal Ssig related to the pixel B51 in the blue color. The AD converter circuit 47 receives, through the signal line SGL3, the signal Ssig related to the pixel B71 in the blue color.

Likewise, for example, in the single horizontal period (1H) of the timing t26 to t27, the read operation is performed with respect to the eight pixels B91, B111, G130, G150, G161, G181, R200, and R220. At this occasion, as illustrated in FIG. 7C, the signal lines SGL0, SGL1, SGL6, and SGL7 (the solid lines) respectively transmit the signals Ssig related to the pixels G161, G181, G130, and G150 in the green color. The signal lines SGL2 to SGL5 (the broken lines) respectively transmit the signals Ssig related to the pixels R200 and R220 in the red color and the pixels B91 and B111 in the blue color. The selector 31, as illustrated in FIG. 7C, couples the signal line SGL0 to the AD converter circuit 42, couples the signal line SGL1 to the AD converter circuit 43, couples the signal line SGL2 to the AD converter circuit 40, couples the signal line SGL3 to the AD converter circuit 41, couples the signal line SGL4 to the AD converter circuit 46, couples the signal line SGL5 to the AD converter circuit 47, couples the signal line SGL6 to the AD converter circuit 44, and couples the signal line SGL7 to the AD converter circuit 45. Thus, the AD converter circuit 40 receives, through the signal line SGL2, the signal Ssig related to the pixel R200 in the red color. The AD converter circuit 41 receives, through the signal line SGL3, the signal Ssig related to the pixel R220 in the red color. The AD converter circuit 42 receives, through the signal line SGL0, the signal Ssig related to the pixel G161 in the green color. The AD converter circuit 43 receives, through the signal line SGL1, the signal Ssig related to the pixel G181 in the green color. The AD converter circuit 44 receives, through the signal line SGL6, the signal Ssig related to the pixel G130 in the green color. The AD converter circuit 45 receives, through the signal line SGL7, the signal Ssig related to the pixel G150 in the green color. The AD converter circuit 46 receives, through the signal line SGL4, the signal Ssig related to the pixel B91 in the blue color. The AD converter circuit 47 receives, through the signal line SGL5, the signal Ssig related to the pixel B111 in the blue color.

Likewise, for example, in the single horizontal period (1H) of the timing t27 to t28, the read operation is performed with respect to the eight pixels B131, B151, G170, G190, G201, G221, R240, and R260. At this occasion, as illustrated in FIG. 7D, the signal lines SGL0 to SGL3 (the solid lines) respectively transmit the signals Ssig related to the pixels G170, G190, G201, and G221 in the green color. The signal lines SGL4 to SGL7 (the broken lines) respectively transmit the signals Ssig related to the pixels R240 and R260 in the red color and the pixels B131 and B151 in the blue color. The selector 31, as illustrated in FIG. 7D, couples the signal line SGL0 to the AD converter circuit 42, couples the signal line SGL1 to the AD converter circuit 43, couples the signal line SGL2 to the AD converter circuit 44, couples the signal line SGL3 to the AD converter circuit 45, couples the signal line SGL4 to the AD converter circuit 40, couples the signal line SGL5 to the AD converter circuit 41, couples the signal line SGL6 to the AD converter circuit 46, and couples the signal line SGL7 to the AD converter circuit 47. Thus, the AD converter circuit 40 receives, through the signal line SGL4, the signal Ssig related to the pixel R240 in the red color. The AD converter circuit 41 receives, through the signal line SGL5, the signal Ssig related to the pixel R260 in the red color. The AD converter circuit 42 receives, through the signal line SGL0, the signal Ssig related to the pixel G170 in the green color. The AD converter circuit 43 receives, through the signal line SGL1, the signal Ssig related to the pixel G190 in the green color. The AD converter circuit 44 receives, through the signal line SGL2, the signal Ssig related to the pixel G201 in the green color. The AD converter circuit 45 receives, through the signal line SGL3, the signal Ssig related to the pixel G221 in the green color. The AD converter circuit 46 receives, through the signal line SGL6, the signal Ssig related to the pixel B131 in the blue color. The AD converter circuit 47 receives, through the signal line SGL7, the signal Ssig related to the pixel B151 in the blue color.

Thus, in the imaging device 1, the AD converter circuits 42 to 45 perform the AD conversion on the basis of the signals Ssig related to the pixels G in the green color. Moreover, the AD converter circuits 40, 41, 46, and 47 perform the AD conversion on the basis of the signals Ssig related to the pixels R in the red color and the pixels B in the blue color. As described, in the imaging device 1, the AD converter circuits 40 to 47 are allowed to correspond to the colors of the pixels on which the read operation is performed. Hence, it is possible to restrain the image quality from being affected by variations in characteristics of the AD converter circuits 40 to 47.

Moreover, in the imaging device 1, as illustrated in FIG. 6, at timing of a start of each horizontal period, the read operation is started with respect to the two pixel units U in this example. Specifically, the imaging controller 20 starts the read operation with respect to the two pixel units U1 and U2 at the timing t21, starts the read operation with respect to the two pixel units U3 and U4 at the timing t22 that is one horizontal period later, starts the read operation with respect to the two pixel units U5 and U6 at the timing t23 that is one horizontal period later, and starts the read operation with respect to the two pixel units U7 and U8 at the timing t24 that is one horizontal period later. This makes it possible, in the imaging device 1, to bring periods of the read operation with respect to the pixels G in the green color in the adjacent pixel lines closer to each other, as described later. Hence, it is possible to enhance the image quality.

Furthermore, in the imaging device 1, the order of the read operation with respect to the four pixels in each of the pixel units U is mutually the same. Specifically, the imaging controller 20, first, performs the read operation with respect to the pixel R in the red color (e.g., the pixel R00) disposed on the upper left, thereafter, performs the read operation with respect to the pixel G in the green color (e.g., the pixel G01) disposed on the upper right, thereafter, performs the read operation with respect to the pixel G in the green color (e.g., the pixel G10) disposed on the lower left, and lastly, performs the read operation with respect to the pixel B in the blue color (e.g., the pixel B11) disposed on the lower right. In particular, the imaging controller 20 performs the read operation successively with respect to the two pixels G in the green color (e.g., the pixels G01 and G10) in the pixel unit U. This makes it possible, in the imaging device 1, to bring the periods of the read operation of the pixels G in the green color in the adjacent pixel lines closer to each other, as described later. Hence, it is possible to enhance the image quality.

In other words, in the imaging device 1, the scanner 22 controls the pixel array 10 using the reset signal RST, the control signal TG1 to TG4, and the select signal SEL, to bring the periods of the read operation of the pixels G in the green color in the adjacent pixel lines closer to each other. Hence, it is possible to enhance the image quality.

Comparative Example

Description is given next of the workings of this embodiment, in comparison with a comparative example. This comparative example is different from this embodiment in the order of the read operation with respect to the pixels.

FIG. 8 illustrates one example of the read operation in an imaging device 1R according to the comparative example.

At timing t31, an imaging controller 20R of the imaging device 1R starts the read operation with respect to the seven pixel units U1 to U7 in this example. Moreover, in a period of the timing t31 to t35, the imaging controller 20R performs the read operation with respect to the four pixels R00, G01, G10, and B11 in the pixel unit U1 in this order, and performs the read operation with respect to the four pixels G30, B31, R20, and G21 in the pixel unit U2 in this order. The same applies to the pixel units U3 to U7.

Furthermore, at timing t33, the imaging controller 20R starts the read operation with respect to the single pixel unit U8 in this example. Moreover, in a period of the timing t33 to t37, the imaging controller 20R performs the read operation with respect to the four pixels R140, G141, G150, and B151 in the pixel unit U8 in this order.

Moreover, at and after the timing t35, the imaging controller 20R performs the read operation with respect to the next eight pixel units U9 to U16, in a similar manner to the read operation with respect to these eight pixel units U1 to U8.

FIG. 9 illustrates an example of a captured image by the imaging device 1R according to the comparative example. FIG. 9 provides, in an enlarged manner, an image in an area A2 in the vicinity of a left side of a rectangle W1, in a captured image that photographs the rectangle A1 that is making a smooth movement to the left, as illustrated in FIG. 10. In this example, as illustrated in FIG. 9, in the captured image, a comb-like pattern W1 and shoulders W2 appear in the vicinity of a border of the rectangle W1.

One cause of the comb-like pattern W1 is that there is a part in which the periods of the read operation with respect to the pixels G in the green color in the adjacent pixel lines are spaced apart from each other, as illustrated in (B) of FIG. 8. Specifically, for example, timing of the read operation with respect to the pixel G21 in the pixel unit U2 and timing of the read operation with respect to the pixel G30 are shifted from each other by three horizontal periods. Timing of the read operation with respect to the pixel G61 in the pixel unit U4 and timing of the read operation with respect to the pixel G70 are shifted from each other by the three horizontal periods. Timing of the read operation with respect to the pixel G101 in the pixel unit U6 and timing of the read operation with respect to the pixel G110 are shifted from each other by the three horizontal periods. Accordingly, in the imaging device 1R, the comb-like pattern W1 appears in the captured image, corresponding to an amount of the movement of the rectangle A1 during a period of the three horizontal periods.

Moreover, one cause of the shoulders W2 is that a period of the read operation of the pixel units U1 to U7 and a period of the read operation of the next pixel units U9 to U15 are spaced apart from each other, as illustrated in (B) of FIG. 8. In other words, the timing (the timing t31) of the start of the read operation with respect to the pixel units U1 to U7 and the timing (the timing t35) of the start of the read operation with respect to the pixel units U9 to U15 are shifted from each other by four horizontal periods. Accordingly, in the imaging device 1R, the shoulders W2 appear in the captured image, corresponding to an amount of the movement of the rectangle A1 during a period of the four horizontal periods.

As described above, in the imaging device 1R, the comb-like pattern W1 and the shoulders W2 appear in the captured image. As a result, in the imaging device 1R, there is possibility of unnatural blur of an outline of an object, in the captured image. In this case, the image quality is lowered.

In contrast, in the imaging device 1 according to this embodiment, as illustrated in (B) of FIG. 6, the periods of the read operation of the pixels G in the green color in the adjacent pixel lines are brought closer to each other. Specifically, for example, a shift between the timing of the read operation with respect to the pixel G01 in the pixel unit U1 and the timing of the read operation with respect to the pixel G10 is one horizontal period. Moreover, for example, the read operation with respect to the pixel G30 in the pixel unit U2 and the read operation with respect to the pixel G41 in the pixel unit U3 are performed in the same horizontal period. In other words, in the imaging device 1, an amount of the shift between the periods of the read operation of the pixels G in the green color in the adjacent pixel lines is one horizontal period or less.

FIG. 11 illustrates one example of the captured image by the imaging device 1 according to this embodiment. As described, in the imaging device 1 according to this embodiment, the amount of the shift between the periods of the read operation of the pixels G in the green color in the adjacent pixel lines is decreased. This makes it possible to reduce the comb-like pattern W1 and the shoulders W2, as compared to the case of the imaging device 1R (FIG. 9) according to the comparative example. As a result, in the imaging device 1, it is possible to enhance the image quality of the captured image.

Effects

As described, in this embodiment, in each horizontal period, the read operation is started with respect to one or more (two in this example) pixel units U. This makes it possible to bring the periods of the read operation of the pixels in the green color in the adjacent pixel lines closer to each other. Hence, it is possible to enhance the image quality of the captured image.

Moreover, in this embodiment, the order of the read operation with respect to the four pixels in each of the pixel units U is mutually the same for all the pixel units U. In particular, the read operation is performed successively with respect to the two pixels in the green color (e.g., the pixels G01 and G10) in the pixel unit U. This makes it possible to bring the periods of the read operation of the pixels in the green color in the adjacent pixel lines closer to each other. Hence, it is possible to enhance the image quality of the captured image.

Furthermore, in this embodiment, each of the AD converter circuits performs the correlated double sampling. Hence, it is possible to enhance the image quality of the captured image.

In addition, in this embodiment, the AD converter circuits are associated with the colors of the pixels on which the read operation is performed. This makes it possible to restrain the image quality from being affected by the variations in the characteristics of the AD converter circuits. Hence, it is possible to enhance the image quality of the captured image.

Modification Example 1

In the forgoing embodiment, the signal lines SGL are provided at the rate of eight for the pixels R, G, and B of the two columns, with the eight AD converter circuits 41 to 47 provided. However, this is non-limiting. In the following, this modification example is described, with reference to two examples (imaging devices 1A and 1B).

In the imaging device 1A, the signal lines SGL are provided at the rate of four for the pixels R, G, and B of the two columns, with the four AD converter circuits provided.

FIG. 12 illustrates one example of the read operation in the imaging device 1A, with (A) illustrating the arrangement of the pixels R, G, and B of the 0th column and the 1st column together with the four signal lines SGL0 to SGL3, and with (B) illustrating the read operation with respect to the pixels R, G, and B.

At timing t41, an imaging controller 20A of the imaging device 1A starts the read operation with respect to the single pixel unit U1. Moreover, in a period of the timing t41 to t45, the imaging controller 20A performs the read operation with respect to the four pixels R00, G01, G10, and B11 in the pixel unit U1 in this order.

Moreover, at timing t42, the imaging controller 20A starts the read operation with respect to the single pixel unit U2. Furthermore, in a period of the timing t42 to t46, the imaging controller 20A performs the read operation with respect to the four pixels R20, G21, G30, and B31 in the pixel unit U3 in this order.

The same applies to the other pixels R, G, and B.

In the imaging device 1B, the signal lines SGL are provided at the rate of twelve for the pixels R, G, and B of the two columns, with the twelve AD converter circuits provided.

FIG. 13 illustrates one example of the read operation in the imaging device 1A, with (A) illustrating the arrangement of the pixels R, G, and B of the 0th column and the 1st column together with the four signal lines SGL0 to SGL3, and with (B) illustrating the read operation with respect to the pixels R, G, and B.

At timing t51, an imaging controller 20B of the imaging device 1B starts the read operation with respect to the three pixel units U1 to U3. Moreover, in a period of the timing t51 to t55, the imaging controller 20B performs the read operation with respect to the four pixels R00, G01, G10, and B11 in the pixel unit U1 in this order, performs the read operation with respect to the four pixels R20, G21, G30, and B31 in the pixel unit U2 in this order, and performs the read operation with respect to the four pixels R40, G41, G50, and B51 in the pixel unit U3 in this order.

Moreover, at timing t52, the imaging controller 20B starts the read operation with respect to the three pixel units U4 to U6. Furthermore, in a period of the timing t52 to t56, the imaging controller 20B performs the read operation with respect to the four pixels R60, G61, G70, and B71 in the pixel unit U4 in this order, performs the read operation with respect to the four pixels R80, G81, G90, and B91 in the pixel unit U5 in this order, and performs the read operation with respect to the four pixels R100, G101, G110, and B111 in the pixel unit U6 in this order.

The same applies to the other pixels R, G, and B.

Modification Example 2

In the forgoing embodiment, performing the read operation with respect to each of the pixel units U includes, first, performing the read operation with respect to the pixel R in the red color disposed on the upper left, thereafter, performing the read operation with respect to the pixel G in the green color disposed on the upper right, thereafter, performing the read operation with respect to the pixel G in the green color disposed on the lower left, and lastly, performing the read operation with respect to the pixel B in the blue color disposed on the lower right. However, this is non-limiting. For example, as in an imaging device 1C illustrated in FIG. 14, first, the read operation may be performed with respect to the pixel R in the red color (e.g., the pixel R00) disposed on the upper left. Thereafter, the read operation may be performed with respect to the pixel B in the blue color (e.g., the pixel B11) disposed on the lower right. Thereafter, the read operation may be performed with respect to the pixel G in the green color (e.g., the pixel G01) disposed on the upper right. Lastly, the read operation may be performed with respect to the pixel G in the green color (e.g., the pixel G10) disposed on the lower left lower right. In this case as well, it is possible to bring the periods of the read operation of the pixels G in the green color in the adjacent pixel lines closer to each other. Hence, it is possible to enhance the image quality of the captured image.

Modification Example 3

In the forgoing embodiment, the periods of the read operation of the pixels in the green color in the adjacent pixel lines are brought closer to each other. However, this is non-limiting. In one alternative, for example, as in an imaging device 1D illustrated in FIG. 15, the periods of the read operation of the pixel R in the red color and the pixel B in the blue color may be brought closer to each other. In the imaging device 1D, performing the read operation with respect to each of the pixel units U includes, first, performing the read operation with respect to the pixel G in the green color (e.g., the pixel G01) disposed on the upper right, thereafter, performing the read operation with respect to the pixel R in the red color (e.g., the pixel R00) disposed on the upper left, thereafter, performing the read operation with respect to the pixel B in the blue color (e.g., the pixel B11) disposed on the lower right, and lastly, performing the read operation with respect to the pixel G in the green color (e.g., the pixel G10) disposed on the lower left. In this way as well, it is possible to reduce the shoulders W2 in the captured image. Hence, it is possible to enhance the image quality of the captured image.

Modification Example 4

In the forgoing embodiment, the four pixels share the single floating diffusion FD, but this is non-limiting. In the following, description is given on a case where the two pixels share the single floating diffusion FD, with reference to some examples.

FIG. 16 illustrates one example of the read operation in an imaging device 1E according to this modification example, with (A) illustrating the arrangement of the pixels R, G, and B of the 0th column and the 1st column, and with (B) illustrating the read operation with respect to the pixels R, G, and B. In the imaging device 1E, the signal lines SGL are provided at the rate of eight for the pixels R, G, and B of the two columns, with the eight AD converter circuits provided. In this example, the two pixels disposed in the two rows by the single column share the single floating diffusion FD, and constitute the pixel unit U. Specifically, in one of the pixel units U, for example, the pixel R in the red color (e.g., the pixel R00) is disposed on upper side, and the pixel G in the green color (e.g., the pixel G10) is disposed on lower side. Moreover, in another of the pixel units U, for example, the pixel G in the green color (e.g., the pixel G01) is disposed on the upper side, and the pixel B in the blue color (e.g., the pixel B11) is disposed on the lower side. In this example, the pixels R00 and G10 that constitute the single pixel unit U are coupled to the signal line SGL0. Likewise, the pixels G10 and B11 are coupled to the signal line SGL1. The pixels R20 and G30 are coupled to the signal line SGL2. The pixels G21 and B31 are coupled to the signal line SGL3. The pixels R40 and G50 are coupled to the signal line SGL4. The pixels G41 and B51 are coupled to the signal line SGL5. The pixels R60 and G70 are coupled to the signal line SGL6. The pixels G61 and B71 are coupled to the signal line SGL7.

At timing t61, an imaging controller 20E of the imaging device 1E starts the read operation with respect to the four pixel units U. In other words, at the timing t61, the imaging controller 20E starts the read operation with respect to the two pixels R00 and G10 that constitute the single pixel unit U, the two pixels G01 and B11 that constitute the single pixel unit U, the two pixels R20 and G30 that constitute the single pixel unit U, and the two pixels G21 and B31 that constitute the single pixel unit U. Moreover, in a period of the timing t61 to t63, the imaging controller 20E performs the read operation with respect to the two pixels R00 and G10 in this order, performs the read operation with respect to the two pixels G01 and B11 in this order, performs the read operation with respect to the two pixels R20 and G30 in this order, and performs the read operation with respect to the two pixels G21 and B31 in this order. Specifically, for example, the imaging controller 20E performs the read operation simultaneously with respect to the four pixels R00, G01, R20, and G21 in the single horizontal period (1H) of the timing t61 to t62, and performs the read operation with respect to the four pixels B11, G10, B31, and G30 in the single horizontal period (1H) of the timing t62 to t63. It is to be noted that in (B) of FIG. 16, for purposes of convenience of description, for example, in the period of the timing t61 to t62, the pixel R00 and the pixel G01 are illustrated side by side along a time axis, which means that the read operation with respect to the pixel R00 and the read operation with respect to the pixel G01 are performed simultaneously in the timing t61 to t62.

Moreover, at the timing t62, the imaging controller 20E starts the read operation with respect to the four pixel units U. In other words, the imaging controller 20E starts the read operation with respect to the two pixels R40 and G50 that constitute the single pixel unit U, the two pixels G41 and B51 that constitute the single pixel unit U, the two pixels R60 and G70 that constitute the single pixel unit U, and the two pixels G61 and B71 that constitute the single pixel unit U. Moreover, in a period of the timing t62 to t64, the imaging controller 20E performs the read operation with respect to the two pixels R40 and G50 in this order, performs the read operation with respect to the two pixels G41 and B51 in this order, performs the read operation with respect to the two pixels R60 and G70 in this order, and performs the read operation with respect to the two pixels G61 and B71 in this order. Specifically, for example, the imaging controller 20E performs the read operation simultaneously with respect to the four pixels R40, G41, R60, and G61 in the single horizontal period (1H) of the timing t62 to t63, and performs the read operation simultaneously with respect to the four pixels B51, G50, B71, and G70 in the single horizontal period (1H) of the timing t63 to t64.

The same applies to the other pixels R, G, and B. In this case as well, it is possible to bring the periods of the read operation of the pixels G in the green color in the adjacent pixel lines closer to each other. Hence, it is possible to enhance the image quality.

FIG. 17 illustrates one example of the read operation in another imaging device 1F according to this modification example, with (A) illustrating the arrangement of the pixels R, G, and B of the 0th column and the 1st column, and with (B) illustrating the read operation with respect to the pixels R, G, and B. In the imaging device 1F, the signal lines SGL are provided at the rate of sixteen for the pixels R, G, and B of the two columns, with the sixteen AD converter circuits provided. In this example, as with the case of the forgoing imaging device 1E (FIG. 16), the two pixels arranged in the two rows by the single column share the single floating diffusion FD, and constitute the pixel unit U.

At timing t71, an imaging controller 20F of the imaging device 1F starts the read operation with respect to the eight pixel units U. Moreover, for example, the imaging controller 20F performs the read operation simultaneously with respect to the eight pixels G01, G10, G21, G30, G41, G50, G61, and G70 in the single horizontal period (1H) of the timing t71 to t72, and performs the read operation simultaneously with respect to the eight pixels R00, B11, R20, B31, R40, B51, R60, and B71 in the single horizontal period (1H) of the timing t72 to t73.

Moreover, at the timing t72, the imaging controller 20F starts the read operation with respect to the eight pixel units U. Furthermore, the imaging controller 20F performs the read operation simultaneously with respect to the eight pixels G81, G90, G101, G110, G121, G130, G141, and G150 in the single horizontal period (1H) of the timing t72 to t73, and performs the read operation simultaneously with respect to the eight pixels R80, B91, R100, B111, R120, B131, R140, and B151 in the single horizontal period (1H) of the timing t73 to t74.

The same applies to the other pixels R, G, and B. In this case as well, it is possible to bring the periods of the read operation of the pixels in the green color in the adjacent pixel lines closer to each other. Hence, it is possible to enhance the image quality of the captured image.

FIG. 18 illustrates one example of the read operation in another imaging device 1G according to this modification example, with (A) illustrating the arrangement of the pixels R, G, and B of the 0th column and the 1st column, and with (B) illustrating the read operation with respect to the pixels R, G, and B. In the imaging device 1G, the signal lines SGL are provided at the rate of twenty-four for the pixels R, G, and B of the two columns, with the twenty-four AD converter circuits provided. In this example, as with the case of the forgoing imaging device 1E (FIG. 16), the two pixels disposed in the two rows by the single column share the single floating diffusion FD, and constitute the pixel unit U.

At timing t81, an imaging controller 20G of the imaging device 1G starts the read operation with respect to the twelve pixel units U. Moreover, for example, the imaging controller 20G performs the read operation simultaneously with respect to the twelve pixels G01, G10, G21, G30, G41, G50, G61, G70, G81, G90, G101, and G110 in the single horizontal period (1H) of the timing t81 to t82, and performs the read operation simultaneously with respect to the twelve pixels R00, B11, R20, B31, R40, B51, R60, B71, R80, B91, R100, and B111 in the single horizontal period (1H) of the timing t82 to t83.

Furthermore, at the timing t82, the imaging controller 20G starts the read operation with respect to the twelve pixel units U. Moreover, for example, the imaging controller 20G performs the read operation simultaneously with respect to the twelve pixels G121, G130, G141, G150, G161, G170, G181, G190, G201, G210, G221, and G230 in the single horizontal period (1H) of the timing t82 to t83, and performs the read operation simultaneously with respect to the twelve pixels R120, B131, R140, B151, R160, B171, R180, B191, R200, B211, R220, and B231 in the single horizontal period (1H) of the timing t83 to t84.

The same applies to the other pixels R, G, and B. In this case as well, it is possible to bring the periods of the read operation of the pixels in the green color in the adjacent pixel lines closer to each other. Hence, it is possible to enhance the image quality of the captured image.

In the forgoing examples, the two pixels arranged in the two rows by the single column share the single floating diffusion FD, but this is non-limiting. In one alternative, for example, the two pixels arranged in the single row by the two columns may share the single floating diffusion FD. In the following, description is given on an imaging device 1H according to this modification example.

FIG. 19 illustrates one example of the read operation in the imaging device 1H, with (A) illustrating the arrangement of the pixels R, G, and B of the 0th column and the 1st column, and with (B) illustrating the read operation with respect to the pixels R, G, and B. In the imaging device 1H, the signal lines SGL are provided at the rate of sixteen for the pixels R, G, and B of the two columns, with the sixteen AD converter circuits provided. In this example, the two pixels arranged in the single row by the two columns share the single floating diffusion FD, and constitute the pixel unit U. Specifically, in one of the pixel units U, for example, the pixel R in the red color (e.g., the pixel R00) is disposed on left side. The pixel G in the green color (e.g., the pixel G01) is disposed on right side. Moreover, in another of the pixel units U, for example, the pixel G in the green color (e.g., G10) is disposed on the left side. The pixel B in the blue color (e.g., the pixel B11) is disposed on the right side.

At timing t91, an imaging controller 20H of the imaging device 1H starts the read operation with respect to the eight pixel units U. Moreover, for example, the imaging controller 20H performs the read operation simultaneously with respect to the eight pixels G01, G10, G21, G30, G41, G50, G61, and G70 in the single horizontal period (1H) of the timing t91 to t92, and performs the read operation simultaneously with respect to the eight pixels R00, B11, R20, B31, R40, B51, R60, and B71 in the single horizontal period (1H) of the timing t92 to t93.

Moreover, at the timing t92, the imaging controller 20H starts the read operation with respect to the eight pixel units U. Moreover, for example, the imaging controller 20H performs the read operation simultaneously with respect to the eight pixels G81, G90, G101, G110, G121, G130, G141, and G150 in the single horizontal period (1H) of the timing t92 to t93, and performs the read operation simultaneously with respect to the eight pixels R80, B91, R100, B111, R120, B131, R140, and B151 in the single horizontal period (1H) of the timing t93 to t94.

The same applies to the other pixels R, G, and B. In this case as well, it is possible to bring the periods of the read operation of the pixels in the green color in the adjacent pixel lines closer to each other. Hence, it is possible to enhance the image quality of the captured image.

Modification Example 5

In the forgoing embodiment, the plurality of the pixels R, G, and B are disposed in the so-called Bayer array pattern, but this is non-limiting. In the following, description is given on an imaging device 1J according to this modification example.

FIG. 20 illustrates one configuration example of a pixel array 10J of the imaging device 1J. In the pixel array 10J, unlike the pixel array 10 (FIGS. 1 and 3) according to the forgoing embodiment, the pixels of the six rows by the six columns are repeatedly disposed in the vertical direction (the longitudinal direction) and the horizontal direction (the lateral direction). Moreover, in the pixel array 10J, the two pixels disposed in the two rows by the single column share the single floating diffusion FD, and constitute the pixel unit U. Furthermore, in the pixel array 10J, the signal lines SGL are provided at the rate of six for the pixels R, G, and B of the two columns.

FIG. 21A illustrates one example of the read operation in the imaging device 1J, with (A) illustrating the arrangement of the pixels R, G, and B of the 0th column and the 1st column, and with (B) illustrating the read operation with respect to the pixels R, G, and B.

At timing t101, an imaging controller 20J of the imaging device 1J starts the read operation with respect to the four pixel units U. In other words, at the timing t101, the imaging controller 20J starts the read operation with respect to the two pixels R00 and R10 that constitute the single pixel unit U, the two pixels B01 and G11 that constitute the single pixel unit U, the two pixels G20 and G30 that constitute the single pixel unit U, and the two pixels B21 and R31 that constitute the single pixel unit U. Moreover, for example, the imaging controller 20J performs the read operation simultaneously with respect to the four pixels G00, G11, G20, and B21 in the single horizontal period (1H) of the timing t101 to t102, and performs the read operation simultaneously with respect to the four pixels B01, R10, G30, and R31 in the single horizontal period (1H) of the timing t102 to t103.

Moreover, at the timing t102, the imaging controller 20J starts the read operation with respect to the two pixel units U. In other words, at the timing t102, the imaging controller 20J starts the read operation with respect to the two pixels B40 and G50 that constitute the single pixel unit U, and the two pixels G41 and R51 that constitute the single pixel unit U. Furthermore, for example, the imaging controller 20J performs the read operation simultaneously with respect to the two pixels G41 and G50 in the single horizontal period (1H) of the timing t102 to t103, and performs the read operation simultaneously with respect to the two pixels B40 and R51 in the single horizontal period (1H) of the timing t103 to t104.

Moreover, at the timing t103, the imaging controller 20J starts the read operation with respect to the four pixel units U. In other words, at the timing t103, the imaging controller 20J starts the read operation with respect to the two pixels G60 and R70 that constitute the single pixel unit U, the two pixels B61 and G71 that constitute the single pixel unit U, the two pixels G80 and G90 that constitute the single pixel unit U, and the two pixels B81 and R91 that constitute the single pixel unit U. Furthermore, for example, the imaging controller 20J performs the read operation simultaneously with respect to the four pixels G60, G71, G80 and B81 in the single horizontal period (1H) of the timing t103 to t104, and performs the read operation simultaneously with respect to the four pixels B61, R70, G90, and R91 in the single horizontal period (1H) of the timing t104 to t105.

Moreover, at the timing t104, the imaging controller 20J starts the read operation with respect to the two pixel units U. In other words, at the timing t104, the imaging controller 20J starts the read operation with respect to the two pixels B100 and G110 that constitute the single pixel unit U, and with respect to the two pixels G101 and R111 that constitute the single pixel unit U. Furthermore, for example, the imaging controller 20J performs the read operation simultaneously with respect to the two pixels G101 and G110 in the single horizontal period (1H) of the timing t104 to t105, and performs the read operation simultaneously with respect to the two pixels B100 and R111 in the single horizontal period (1H) of the timing t105 to t106.

FIG. 21B illustrates one example of the read operation in the imaging device 1J, with (A) illustrating the arrangement of the pixels R, G, and B of the 2nd column and the 3rd column, and with (B) illustrating the read operation with respect to the pixels R, G, and B. FIG. 21C illustrates one example of the read operation in the imaging device 1J, with (A) illustrating the arrangement of the pixels R, G, and B of the 4th column and the 5th column, and with (B) illustrating the read operation with respect to the pixels R, G, and B. The imaging controller 20J performs the read operation in a similar manner, with respect to the pixels R, G, and B of these columns.

It is to be noted that in this example, the two pixels share the single floating diffusion FD, but this is non-limiting. In one alternative, for example, the four pixels may share the single floating diffusion FD.

OTHER MODIFICATION EXAMPLES

Moreover, two or more of the modification examples may be combined.

2. Application Example

Description is given next of an application example of the imaging device described in the forgoing embodiment and the modification examples.

FIGS. 22A and 22B illustrate an external appearance of a digital camera of a lens-interchangeable single-lens reflex type. FIG. 22A illustrates the external appearance of the digital camera viewed from front (object side). FIG. 22B illustrates the external appearance of the digital camera viewed from rear (image side). The digital camera includes, for example, a main part (a camera body) 450, an interchangeable photographing lens unit (an interchangeable lens) 460, a grip 470, a monitor 480, and a view finder 490. The digital camera is constituted by the imaging device as described above.

The imaging device according to the forgoing example embodiments is applicable to electronic apparatuses in various fields such as a smartphone, a tablet terminal, a video camera, a notebook personal computer, in addition to the digital camera as mentioned above. In other words, the imaging device according to the forgoing example embodiments is applicable to electronic apparatuses in various fields that have a function of displaying images.

Although description has been made by giving the embodiment, the modification examples, and the application example to the electronic apparatuses, the contents of the technology are not limited to the above-mentioned example embodiments and may be modified in a variety of ways.

For example, in the forgoing example embodiments, the voltage Vreset and the voltage Vsig are temporarily converted to time, using the reference signal Sref the voltage level of which gradually changes in accordance with the passage of time. The AD conversion is performed by counting the time. However, this is non-limiting. In one alternative, for example, the AD conversion may be performed directly with respect to the voltage Vreset and the voltage Vsig.

It is to be noted that effects described herein are merely exemplified. Effects of the technology are not limited to the effects described herein. Effects of the technology may further include other effects than the effects described herein.

Moreover, for example, the technology may have the following configuration.

(1) An imaging device, including:
a plurality of pixel units each of which includes a single read terminal and two or more pixels; and
a controller that performs read operation with respect to each of the pixel units and starts, in each unit period, the read operation with respect to predetermined number of the pixel units out of the plurality of the pixel units, the read operation including sequentially reading pixel signals from the two or more pixels through the read terminal at a rate of one pixel every unit period.

(2) The imaging device according to (1), in which
the controller includes a plurality of read circuits that read the pixel signals from the respective pixels of the plurality of the pixel units, and
the predetermined number is smaller than number of the read circuits.

(3) The imaging device according to (1) or (2), in which
the two or more pixels include a plurality of pixels that receive light in different colors from one another, and
the colors of the light received by the two or more pixels in one pixel unit out of the predetermined number of the pixel units are mutually equal to the colors of the light received by the two or more pixels in another pixel unit.

(4) The imaging device according to (3), in which
the two or more pixels include a red pixel that receives the light in a red color, a blue pixel that receives the light in a blue color, and a green pixel that receives the light in a green color.

(5) The imaging device according to (4), in which
the read operation includes sequentially reading the pixel signals, in predetermined color order, from the two or more pixels in each of the pixel units.

(6) The imaging device according to (5), in which
the two or more pixels include the green pixel in two, and
the read operation includes sequentially reading the pixel signals from the two green pixels, in the two successive unit periods.

(7) The imaging device according to any one of (4) to (6), in which
the plurality of the pixel units are in a side-by-side arrangement in a first direction,
the two or more pixels include the red pixel, the blue pixel, and the green pixel in two, and
in each of the pixel units, one of the two green pixels and the red pixel are in a side-by-side arrangement in a second direction that crosses the first direction, and another of the two green pixels and the blue pixel are in a side-by-side arrangement in the second direction, the arrangement of the one of the green pixels and the red pixel and the arrangement of the other of the green pixels and the blue pixel being arranged side by side in the first direction.

(8) The imaging device according to (7), in which
each of side-by-side arrangements of the plurality of the pixels in the second direction constitutes a pixel line, and
the read operation includes reading the pixel signals from respective ones of the two green pixels that belong to the pixel lines in adjacency, in the same unit period or in the successive unit periods.

(9) The imaging device according to (1) or (2), in which
the two or more pixels include a plurality of pixels that receive light in different colors from one another, and
the colors of the light received by the two or more pixels in one pixel unit out of the predetermined number of the pixel units are mutually different from the colors of the light received by the two or more pixels in any one of the other pixel units.

(10) The imaging device according to (9), in which
the plurality of the pixel units include a plurality of first pixel units and a plurality of second pixel units,
the two or more pixels in each of the plurality of the first pixel units include a red pixel that receives the light in a red color and a first green pixel that receives the light in a green color, and
the two or more pixels in each of the plurality of the second pixel units include a blue pixel that receives the light in a blue color and a second green pixel that receives the light in the green color.

(11) The imaging device according to (10), in which
the read operation includes sequentially reading the pixel signals, in predetermined color order, from the two or more pixels in each of the plurality of the first pixel units, and sequentially reading the pixel signals, in predetermined color order, from the two or more pixels in each of the plurality of the second pixel units.

(12) The imaging device according to (11), in which
the plurality of the first pixel units are in a side-by-side arrangement in a first direction,
the plurality of the second pixel units are in a side-by-side arrangement in the first direction,
the arrangement of the plurality of the first pixel units and the arrangement of the plurality of the second pixel units are arranged side by side in a second direction that crosses the first direction,
in each of the plurality of the first pixel units, the red pixel and the first green pixel are arranged side by side in order in the first direction, and
in each of the plurality of the second pixel units, the second green pixel and the blue pixel are arranged side by side in order in the first direction.

(13) The imaging device according to (11), in which
the first pixel units and the second pixel units are alternately arranged side by side in the first direction,
in each of the plurality of the first pixel units, the red pixel and the first green pixel are arranged side by side in a second direction that crosses the first direction, and
in each of the plurality of the second pixel units, the second green pixel and the blue pixel are arranged side by side in the second direction.

(14) The imaging device according to (12) or (13), in which
each of side-by-side arrangements of the plurality of pixels in the second direction constitutes a pixel line, and
the read operation includes reading the pixel signals from respective ones of the two green pixels that belong to the pixel lines in adjacency, in the same unit period or in the successive unit periods.

(15) The imaging device according to any one of (1) to (14), in which
the predetermined number in one unit period is equal to the predetermined number in another unit period.

(16) The imaging device according to any one of (1) to (14), in which
the predetermined number in one unit period is different from the predetermined number in any one of the other unit periods.

(17) A control method of an imaging device, the method including:
performing read operation with respect to each of a plurality of pixel units and starting, in each unit period, the read operation with respect to predetermined number of the pixel units out of the plurality of the pixel units, each of the plurality of the pixel units including a single read terminal and two or more pixels, and the read operation including sequentially reading pixel signals from the two or more pixels through the read terminal at a rate of one pixel every unit period; and
generating captured image data on a basis of the pixel signals of the respective pixels.

(18) An electronic apparatus, including:
an imager; and
a processor that performs predetermined processing using an image taken by the imager,
the imager including
a plurality of pixel units each of which includes a single read terminal and two or more pixels, and
a controller that performs read operation with respect to each of the pixel units and starts, in each unit period, the read operation with respect to predetermined number of the pixel units out of the plurality of the pixel units, the read operation including sequentially reading pixel signals from the two or more pixels through the read terminal at a rate of one pixel every unit period.

This application claims the benefit of Japanese Priority Patent Application JP2015-25024 filed on Feb. 12, 2015, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An imaging device, comprising:
a plurality of pixel units, wherein
each pixel unit of the plurality of pixel units includes a single read terminal and at least two pixels, and
the at least two pixels include a pair of green pixels; and
a controller configured to:
execute a read operation with respect to each pixel unit of the plurality of pixel units; and
start, in each unit period of a plurality of unit periods, the read operation with respect to a first number of pixel units of the plurality of pixel units,
wherein the read operation includes sequential read of pixel signals from the at least two pixels including the pair of green pixels through the single read terminal in two successive unit periods.

2. The imaging device according to claim 1, wherein
the controller includes a plurality of read circuits that is configured to read a pixel signal of the pixel signals from a respective pixel of a pixel unit of the plurality of pixel units, and
the first number of pixel units is smaller than a number of the plurality of read circuits.

3. The imaging device according to claim 1, wherein
the at least two pixels further include a red pixel configured to receive light in a red color and a blue pixel configured to receive light in a blue color,
the pair of green pixels is configured to receive light in a green color,
the at least two pixels are configured to receive light in different colors from one another, and
the colors of the light received by the at least two pixels in a first pixel unit of the first number of pixel units are mutually equal to the colors of the light received by the at least two pixels in a second pixel unit of the first number of pixel units.

4. The imaging device according to claim 3, wherein
the read operation sequentially further reads the pixel signals, in a specific color order, from the at least two pixels in each pixel unit of the plurality of pixel units.

5. The imaging device according to claim 3, wherein
the plurality of pixel units is in a side-by-side arrangement in a first direction,
in each pixel unit of the plurality of pixel units, a first green pixel of the pair of green pixels and the red pixel are in the side-by-side arrangement in a second direction that crosses the first direction, and a second green pixel of the pair of green pixels and the blue pixel are in the side-by-side arrangement in the second direction, and
the side-by-side arrangement of the first green pixel and the red pixel and the side-by-side arrangement of the second green pixel and the blue pixel are arranged side-by-side in the first direction.

6. The imaging device according to claim 5, wherein
the side-by-side arrangement in the second direction constitutes a pixel line, and
the read operation further reads the pixel signals from the first green pixel and the second green pixel that belong to adjacent pixel lines, one of in a same unit period or in the two successive unit periods.

7. The imaging device according to claim 1, wherein
the plurality of pixel units includes a plurality of first pixel units and a plurality of second pixel units,
the at least two pixels in each first pixel unit of the plurality of first pixel units includes a red pixel configured to receive light in a red color and a first green pixel of the pair of green pixels configured to receive light in a green color,
the at least two pixels in each second pixel unit of the plurality of second pixel units includes a blue pixel configured to receive light in a blue color and a second green pixel of the pair of green pixels configured to receive the light in the green color
the at least two pixels are configured to receive light in different colors from one another, and
the colors of the light received by the at least two pixels in a first pixel unit of the first number of pixel units are different from the colors of the light received by the at least two pixels in a second pixel unit of the first number of pixel units.

8. The imaging device according to claim 7, wherein
the read operation sequentially further reads the pixel signals, in a specific color order, from the at least two pixels in each first pixel unit of the plurality of first pixel units, and
the read operation sequentially further reads the pixel signals, in the specific color order, from the at least two pixels in each second pixel unit of the plurality of second pixel units.

9. The imaging device according to claim 7, wherein
the plurality of first pixel units is in a side-by-side arrangement in a first direction,
the plurality of second pixel units is in the side-by-side arrangement in the first direction,
the side-by-side arrangement of the plurality of first pixel units and the side-by-side arrangement of the plurality of second pixel units are arranged side-by-side in a second direction that crosses the first direction,
in each first pixel unit of the plurality of first pixel units, the red pixel and the first green pixel are arranged side-by-side in a first order in the first direction, and
in each second pixel unit of the plurality of second pixel units, the second green pixel and the blue pixel are arranged side-by-side in a second order in the first direction.

10. The imaging device according to claim 9, wherein
the side-by-side arrangement in the second direction constitutes a pixel line, and
the read operation further reads the pixel signals from the first green pixel and the second green pixel that belong to adjacent pixel lines, one of in a same unit period or in the two successive unit periods.

11. The imaging device according to claim 7, wherein
the plurality of first pixel units and the plurality of second pixel units are alternately arranged side-by-side in a first direction,
in each first pixel unit of the plurality of first pixel units, the red pixel and the first green pixel are arranged side-by-side in a second direction that crosses the first direction, and
in each second pixel unit of the plurality of second pixel units, the second green pixel and the blue pixel are arranged side-by-side in the second direction.

12. The imaging device according to claim 1, wherein
a second number of pixel units in a first unit period of the plurality of unit periods is equal to a third number of pixel units in a second unit period of the plurality of unit periods.

13. The imaging device according to claim 1, wherein
a second number of pixel units in a first unit period of the plurality of unit periods is different from a third number of pixel units in a second unit period of the plurality of unit periods.

14. A control method, comprising:
executing a read operation with respect to each pixel unit of a plurality of pixel units of an imaging device;
starting, in each unit period of a plurality of unit periods, the read operation with respect to a number of pixel units of the plurality of pixel units, wherein
each pixel unit of the plurality of pixel units includes a single read terminal and at least two pixels,
the at least two pixels include a pair of green pixels, and
the read operation includes sequentially reading pixel signals from the at least two pixels including the pair of green pixels through the single read terminal in two successive unit periods; and
generating captured image data based on the pixel signals of the at least two pixels.

15. An electronic apparatus, comprising:
an imager configured to capture an image; and
a processor configured to process the image, wherein the imager includes:
a plurality of pixel units, wherein each pixel unit of the plurality of pixel units includes a single read terminal and at least two pixels, wherein the at least two pixels include a pair of green pixels, and
a controller configured to:
execute a read operation with respect to each pixel unit of the plurality of pixel units; and
start, in each unit period of a plurality of unit periods, the read operation with respect to a determined number of pixel units of the plurality of pixel units,
wherein the read operation includes sequential read of pixel signals from the at least two pixels including the pair of green pixels through the single read terminal in two successive unit periods.

* * * * *